US012606662B2

(12) United States Patent
Otsuka et al.

(10) Patent No.: US 12,606,662 B2
(45) Date of Patent: Apr. 21, 2026

(54) PHOTOSENSITIVE RESIN COMPOSITION, PHOTOSENSITIVE RESIN FILM, MULTILAYERED PRINTED WIRING BOARD, SEMICONDUCTOR PACKAGE, AND METHOD FOR PRODUCING MULTILAYERED PRINTED WIRING BOARD

(71) Applicant: Showa Denko Materials Co., Ltd., Tokyo (JP)

(72) Inventors: Kohei Otsuka, Tokyo (JP); Hayato Sawamoto, Tokyo (JP); Akihiro Nakamura, Tokyo (JP); Norihiko Sakamoto, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 619 days.

(21) Appl. No.: 18/019,024

(22) PCT Filed: Mar. 25, 2021

(86) PCT No.: PCT/JP2021/012623
§ 371 (c)(1),
(2) Date: Jan. 31, 2023

(87) PCT Pub. No.: WO2022/030045
PCT Pub. Date: Feb. 10, 2022

(65) Prior Publication Data

US 2023/0303750 A1 Sep. 28, 2023

(30) Foreign Application Priority Data

Aug. 4, 2020 (JP) ................................ 2020-132596

(51) Int. Cl.
*C08F 279/00* (2006.01)
*C08L 51/00* (2006.01)
(Continued)

(52) U.S. Cl.
CPC .......... *C08F 279/00* (2013.01); *C08L 51/003* (2013.01); *H05K 1/0373* (2013.01);
(Continued)

(58) Field of Classification Search
CPC .. C08F 279/00; C08F 2/44; C08F 2/50; C08F 283/10; C08F 285/00; C08F 290/144;
(Continued)

(56) References Cited

FOREIGN PATENT DOCUMENTS

JP H07-304931 A 11/1995
JP 2014-091790 A 5/2014
(Continued)

OTHER PUBLICATIONS

Endo (Year: 2020).*

*Primary Examiner* — Caleen O Sullivan
(74) *Attorney, Agent, or Firm* — FITCH, EVEN, TABIN & FLANNERY, LLP

(57) ABSTRACT

There is provided a photosensitive resin composition that contains (A) a photopolymerizable compound having an ethylenically unsaturated group, (X) organic particles, and (B) a photopolymerization initiator, in which the photopolymerizable compound (A) having an ethylenically unsaturated group contains (A1) a photopolymerizable compound having an acidic substituent and an alicyclic structure together with an ethylenically unsaturated group. There is provided a photosensitive resin film and a photosensitive resin film for interlayer insulating layer, each of which contains the photosensitive resin composition. There is provided a multilayer printed wiring board and a semiconductor package. There is further provided a method for producing the multilayer printed wiring board.

16 Claims, 1 Drawing Sheet

(51) Int. Cl.
*H05K 1/03* (2006.01)
*H05K 3/00* (2006.01)
*H05K 3/10* (2006.01)
*H10W 70/05* (2026.01)
*H10W 70/69* (2026.01)

(52) U.S. Cl.
CPC .......... *H05K 3/0023* (2013.01); *H10W 70/05* (2026.01); *H10W 70/69* (2026.01); *H05K 3/108* (2013.01); *H05K 2201/0166* (2013.01)

(58) Field of Classification Search
CPC .. C08F 290/06; C08F 222/105; C08L 51/003; H01L 21/4857; H01L 23/49894; H01L 23/49822; H05K 1/0373; H05K 3/0023; H05K 3/108; H05K 2201/0166; H05K 3/4661; H05K 3/4676; H05K 3/46; G03F 7/004; G03F 7/027; G03F 7/028; H10W 70/05; H10W 70/69
USPC ..................... 430/280.1, 270.1, 271.1, 272.1
See application file for complete search history.

(56) References Cited

FOREIGN PATENT DOCUMENTS

| | | | |
|---|---|---|---|
| JP | 2015-022030 | A | 2/2015 |
| JP | 2016-194669 | A | 11/2016 |
| JP | 2017-116652 | A | 6/2017 |
| JP | 2017-134173 | A | 8/2017 |
| JP | 2019-070720 | A | 5/2019 |

* cited by examiner

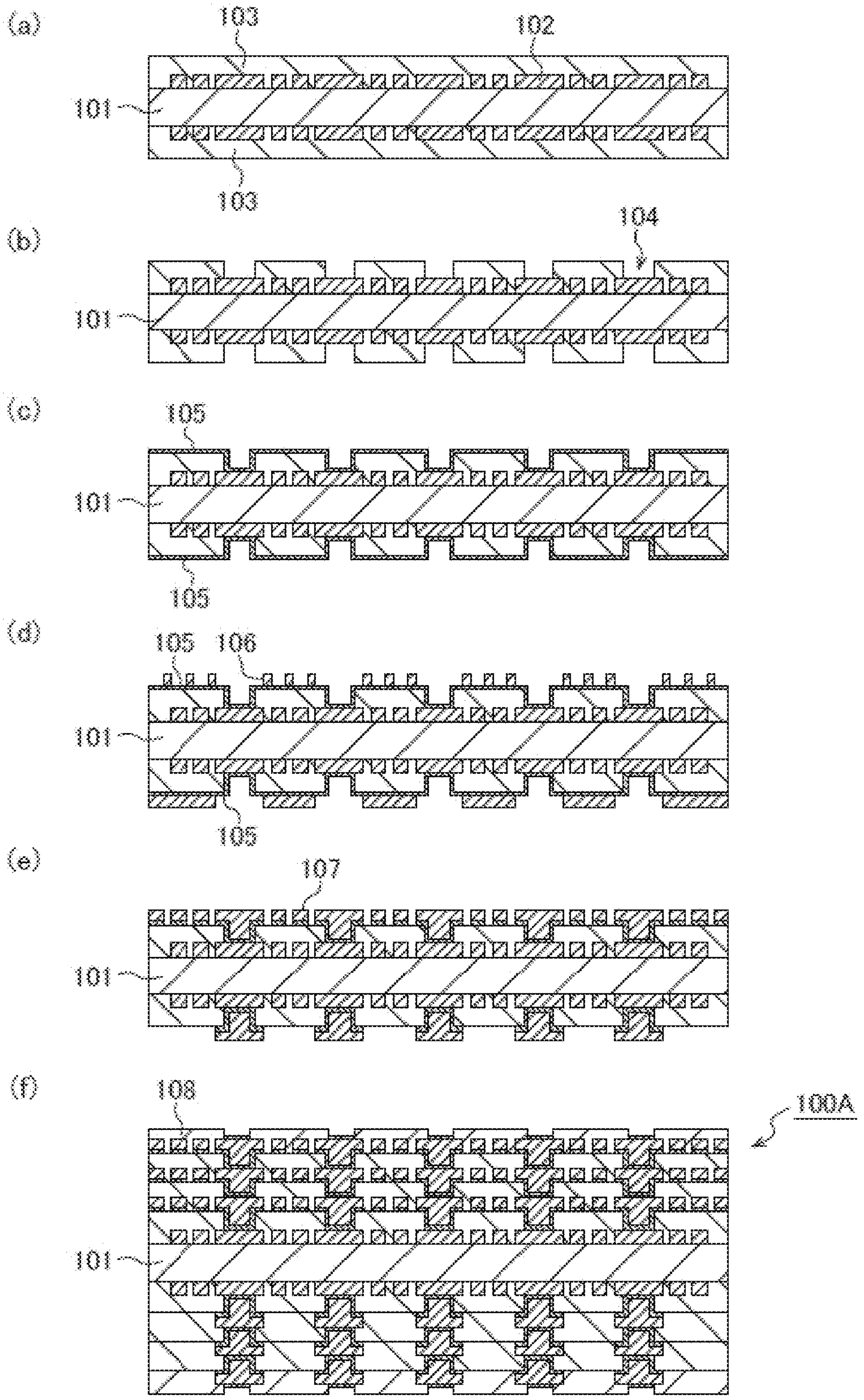
(a)
103
102
101
103
(b)
104
101
(c)
105
101
105
(d)
105
106
101
105
(e)
107
101
(f)
108
100A
101

PHOTOSENSITIVE RESIN COMPOSITION, PHOTOSENSITIVE RESIN FILM, MULTILAYERED PRINTED WIRING BOARD, SEMICONDUCTOR PACKAGE, AND METHOD FOR PRODUCING MULTILAYERED PRINTED WIRING BOARD

CROSS-REFERENCE TO RELATED APPLICATIONS

This application is a U.S. national phase application filed under 35 U.S.C. § 371 of International Application No. PCT/JP2021/012623, filed March 25, designating the United States, which claims priority from Japanese Application No. 2020-132596, filed Aug. 4, 2020, which are incorporated herein by reference in their entireties.

TECHNICAL FIELD

The present disclosure relates to a photosensitive resin composition, a photosensitive resin film, a multilayer printed wiring board, a semiconductor package, and a method for producing a multilayer printed wiring board.

BACKGROUND ART

In recent years, miniaturization and increase of performance of electronic instruments are advanced, and in multilayer printed wiring boards, densification owing to an increase of the number of circuit layers and refinement of wirings proceeds. In particular, densification of a semiconductor package substrate on which a semiconductor chip is mounted, such as ball grid array (BGA) and chip size package (CSP), is conspicuous, and in addition to the refinement of wirings, thinning of an insulating film and more reduction in diameter of a via for interlayer connection (also referred to as a "via hole") are demanded. In addition to the above, following the thinning of an insulating film in a printed wiring board, excellent interlayer electrical insulation reliability, in particular, electrical insulation reliability after moisture absorption [high accelerated stress test (HAST) resistance] is also demanded.

As a method for producing a printed wiring board, there is exemplified a method for producing a multilayer printed wiring board by a build-up method for successively laminating an interlayer insulating layer and a conductor circuit layer to form a multilayer printed wiring board (see, for example, PTL 1). In the multilayer printed wiring board, following the refinement of a circuit, a semi-additive process for forming a circuit by means of plating becomes the mainstream.

In the semi-additive process in the related art, for example, (1) a thermosetting resin film is laminated on a conductor circuit, and the thermosetting resin film is cured by heating to form an "interlayer insulating layer". (2) Subsequently, a via for interlayer connection is formed by means of laser processing, followed by performing a desmear treatment and a roughening treatment by means of an alkaline permanganate treatment or the like. (3) Thereafter, a substrate is subjected to an electroless copper plating treatment, and after forming a pattern using a resist, electrolytic copper plating is performed to form a circuit layer of copper. (4) Subsequently, resist stripping is performed, and flash etching of an electroless layer is performed, whereby a circuit of copper is formed.

As mentioned above, the laser processing is the mainstream as a method for forming a via in the interlayer insulating layer formed upon curing the thermosetting resin film. However, the reduction in diameter of a via by means of laser irradiation using a laser processing machine reaches the limit. Further, in forming a via by a laser processing machine, it is needed to form the respective via holes one by one, and in the case where it is needed to form a large number of vias by means of densification, there is involved such a problem that a lot of time is required for forming the vias, so that the production efficiency is poor.

Under such circumstances, as a method in which a large number of vias can be collectively formed, there is proposed a method of collectively forming a plurality of reduced-diameter vias by the photolithography method by using a photosensitive resin composition containing (A) an acid-modified vinyl group-containing epoxy resin, (B) a photopolymerizable compound, (C) a photopolymerization initiator, (D) an inorganic filler, and (E) a silane compound, in which the content of the inorganic filler (D) is 10% to 80% by mass (see, for example, PTL 2).

CITATION LIST

Patent Literature

PTL 1: JP 7-304931 A
PTL 2: JP 2017-116652 A

SUMMARY OF INVENTION

Technical Problem

In PTL 2, it is considered to be one of issues to prevent a reduction in adhesion strength to plated copper caused by use of the photosensitive resin composition as a material of the interlayer insulating layer or surface protective layer in place of the thermosetting resin composition in the related art, and it is further considered to be an issue regarding resolution of via and adhesion between the substrate of a silicon material and a chip component, and it is mentioned that these issues have been solved. However, in addition to much more refinement of wirings, the thinning of the insulating film and the reduction in diameter of a via hole for interlayer connection are advanced, so that requirements for improving the adhesion strength to plated copper and the electrical insulation reliability are becoming large. Accordingly, there is room for more improvement in the photosensitive resin composition of PTL 2 in these respects.

It is hardly said that the photosensitive resin composition in the related art has sufficient crack resistance such that it is endurable against reflow mounting.

Then, an object of the present disclosure is to provide a photosensitive resin composition, a photosensitive resin composition for photo via formation, and a photosensitive resin composition for interlayer insulating layer, each of which is excellent in resolution of via, adhesion strength to plated copper, electrical insulation reliability, and crack resistance. In addition, another object of the present disclosure is to provide a photosensitive resin film and a photosensitive resin film for interlayer insulating layer, each of which contains the photosensitive resin composition, to provide a multilayer printed wiring board and a semiconductor package, and to provide a method for producing the multilayer printed wiring board.

Solution to Problem

As a result of intensive studies, the present inventors have found that the objects can be achieved by the present disclosure. The present disclosure includes the following [1] to [19].

[1] A photosensitive resin composition containing (A) a photopolymerizable compound having an ethylenically unsaturated group, (X) organic particles, and (B) a photopolymerization initiator, in which the photopolymerizable compound (A) having an ethylenically unsaturated group contains (A1) a photopolymerizable compound having an acidic substituent and an alicyclic structure together with an ethylenically unsaturated group.

[2] The photosensitive resin composition according to the above [1], in which a component (organic substance) constituting the organic particles (X) contains at least one selected from the group consisting of a polyethylene, a polybutadiene, a polystyrene, an acrylonitrile-butadiene copolymer, an acrylonitrile-butadiene-styrene copolymer, a styrene-butadiene copolymer, a styrene-divinylbenzene copolymer, a (meth)acrylic acid ester copolymer, a silicone rubber, polyvinyl alcohol, an epoxy resin, a polyester, a polyamide, a polyimide, a polyamideimide, a polyurethane, polyphenylene ether, and a melamine resin.

[3] The photosensitive resin composition according to the above [1] or [2], in which the organic particles (X) contain core-shell particles.

[4] The photosensitive resin composition according to the above [3], in which a combination (core/shell) of a component constituting cores of the core-shell particles and a component constituting shells thereof is styrene-butadiene copolymer/(meth)acrylic acid ester copolymer, (meth)acrylic acid ester copolymer/epoxy resin, epoxy resin/silicone rubber, acrylonitrile-butadiene copolymer/(meth)acrylic acid ester copolymer, polyethylene/(meth)acrylic acid ester copolymer, polybutadiene/(meth)acrylic acid ester copolymer, or polyester/(meth)acrylic acid ester copolymer.

[5] The photosensitive resin composition according to any one of the above [1] to [4], in which the photopolymerizable compound (A) having an ethylenically unsaturated group further contains at least one selected from the group consisting of (Ai) a monofunctional vinyl monomer having one polymerizable ethylenically unsaturated group, (Aii) a bifunctional vinyl monomer having two polymerizable ethylenically unsaturated groups, and (Aiii) a polyfunctional vinyl monomer having at least three polymerizable ethylenically unsaturated groups.

[6] The photosensitive resin composition according to any one of the above [1] to [5], in which in the photopolymerizable compound (A1) having an acidic substituent and an alicyclic structure together with an ethylenically unsaturated group, the alicyclic structure is an alicyclic structure having 5 to 20 ring carbon atoms.

[7] The photosensitive resin composition according to any one of the above [1] to [6], in which in the photopolymerizable compound (A1) having an acidic substituent and an alicyclic structure together with an ethylenically unsaturated group, the alicyclic structure is composed of two or more rings.

[8] The photosensitive resin composition according to any one of the above [1] to [7], further containing (C) a thermosetting resin.

[9] The photosensitive resin composition according to any one of the above [1] to [8], further containing (D) an elastomer.

[10] The photosensitive resin composition according to the above [9], in which the elastomer (D) contains at least one selected from the group consisting of a styrenic elastomer, an olefinic elastomer, a polyester-based elastomer, a urethane-based elastomer, a polyamide-based elastomer, an acrylic elastomer, and a silicone-based elastomer.

[11] The photosensitive resin composition according to any one of the above [1] to [10], further containing (F) an inorganic filler.

[12] A photosensitive resin composition for photo via formation, containing the photosensitive resin composition according to any one of the above [1] to [11].

[13] A photosensitive resin composition for interlayer insulating layer, containing the photosensitive resin composition according to any one of the above [1] to [11].

[14] A photosensitive resin film containing the photosensitive resin composition according to any one of the above [1] to [11].

[15] A photosensitive resin film for interlayer insulating layer, containing the photosensitive resin composition according to any one of the above [1] to [11].

[16] A multilayer printed wiring board including an interlayer insulating layer formed of the photosensitive resin composition according to any one of the above [1] to [11].

[17] A multilayer printed wiring board including an interlayer insulating layer formed of the photosensitive resin film according to the above [14].

[18] A semiconductor package including the multilayer printed wiring board according to the above [16] or [17] and a semiconductor device.

[19] A method for producing a multilayer printed wiring board including the following (1) to (4):

(1): laminating the photosensitive resin film according to the above [14] on one surface or both surfaces of a circuit substrate;

(2): exposing and developing the photosensitive resin film laminated in the above (1), to form an interlayer insulating layer having a via;

(3): subjecting the via and the interlayer insulating layer to a roughening treatment; and (4): forming a circuit pattern on the interlayer insulating layer.

Advantageous Effects of Invention

According to the present disclosure, it is possible to provide a photosensitive resin composition, a photosensitive resin composition for photo via formation, and a photosensitive resin composition for interlayer insulating layer, each of which is excellent in resolution of via, adhesion strength to plated copper, electrical insulation reliability, and crack resistance. In addition, it is possible to provide a photosensitive resin film and a photosensitive resin film for interlayer insulating layer, each of which contains the photosensitive resin composition, and to provide a multilayer printed wiring board and a semiconductor package, each of which includes an interlayer insulating layer formed of the photosensitive resin composition or the photosensitive resin film.

Further, it is possible to provide a method for efficiently producing a multilayer printed wiring board having a via with a high resolution, high adhesion strength between an interlayer insulating layer and plated copper, and excellent electrical insulation reliability. The via of the multilayer printed wiring board obtained in the production method according to the present disclosure can be made smaller in diameter than a via formed by means of laser processing.

BRIEF DESCRIPTION OF DRAWINGS

FIG. 1 is a schematic view showing an embodiment of a process for producing a multilayer printed wiring board according to the present embodiment.

DESCRIPTION OF EMBODIMENTS

In numerical value ranges described in the present description, an upper limit value or a lower limit value in a respective numerical value range may be substituted by a value described in the section of Examples. In addition, each of the lower limit value and the upper limit value of the numerical value range can be combined in any combination with a lower limit value or an upper limit value of another numerical value range.

Further, in the present description, as for the content of a respective component in the photosensitive resin composition, in the case where plural kinds of substances corresponding to the respective component exist, it means a total content of the plural kinds of substances existing in the photosensitive resin composition unless otherwise indicated.

The term "number of ring carbon atoms" as referred to in the present description means the number of carbon atoms necessary for forming the ring, but the number of carbon atoms in a substituent of the ring is not included. For example, in both of a cyclohexane structure and a methylcyclohexane structure, the number of the ring carbon atoms is 6.

The term "(meth)acrylic XX" means one or both of acrylic XX and methacrylic XX corresponding thereto. The term "(meth)acryloyl group" means one or both of an acryloyl group and a methacryloyl group.

In the present description, for example, the description "10 or more" means 10 and a numerical value more than 10, and the same also applies to a case where the numerical value is different from the above. In addition, for example, the description "10 or less" means 10 and a numerical value less than 10, and the same also applies to a case where the numerical value is different from the above.

In the present description, the "interlayer insulating layer" is a layer located between two conductor layers and for insulating the conductor layers. Examples of the "interlayer insulating layer" in the present description include a cured product of a photosensitive resin film. In the present description, the term "layer" includes a layer in which a part is missing, and a layer on which a via or a pattern is formed.

Further, an embodiment in which matters described in the present description are combined as desired is also included in the present disclosure.

[Photosensitive Resin Composition, Photosensitive Resin Composition for Photo Via Formation, and Photosensitive Resin Composition for Interlayer Insulating Layer]

A photosensitive resin composition according to an embodiment of the present disclosure (hereinafter occasionally referred to simply as "the present embodiment") is a photosensitive resin composition containing (A) a photopolymerizable compound having an ethylenically unsaturated group, (X) organic particles, and (B) a photopolymerization initiator, in which the photopolymerizable compound (A) having an ethylenically unsaturated group contains (A1) a photopolymerizable compound having an acidic substituent and an alicyclic structure together with an ethylenically unsaturated group.

In the present description, the components are occasionally referred to as the component (A), the component (X), the component (B), and the component (A1), and other components are also occasionally referred in the same manner. In the present description, the "resin component" refers to the component (A), the component (X), and the component (B), and other components which may be contained if necessary (for example, components (C), (D), (E), and (H)) are also included. However, an inorganic compound such as (F) an inorganic filler and (G) a pigment as described later, which may be contained if necessary, are not included. In addition, the "solid component" means a nonvolatile component contained in the photosensitive resin composition, exclusive of a volatile substance such as water and a solvent, and refers to a component which, during drying of the resin composition, remains without being volatilized, and which is in a liquid state, a starch syrup-like state, or a waxy state at room temperature in the vicinity of 25° C.

Since the photosensitive resin composition according to the present embodiment is suited for via formation by means of photolithography (hereinafter referred to as "photo via formation"), the present disclosure also provides a photosensitive resin composition for photo via formation. In addition, since the photosensitive resin composition according to the present embodiment is excellent in resolution of via, adhesion strength to plated copper, electrical insulation reliability, and crack resistance, and is useful as an interlayer insulating layer of a multilayer printed wiring board, the present disclosure also provides a photosensitive resin composition for interlayer insulating layer. In the case where the photosensitive resin composition is referred to in the present description, a photosensitive resin composition for photo via formation and a photosensitive resin composition for interlayer insulating layer are also included.

The photosensitive resin composition according to the present embodiment is useful as a negative working-type photosensitive resin composition.

The respective components which can be contained in the photosensitive resin composition are hereinafter described in detail.

<(A) Photopolymerizable Compound Having Ethylenically Unsaturated Group>

The photosensitive resin composition according to the present embodiment contains a photopolymerizable compound having an ethylenically unsaturated group as the component (A) from the viewpoint of adhesion strength to plated copper. Examples of the ethylenically unsaturated group in the component (A) include a vinyl group, an allyl group, a propargyl group, a butenyl group, an ethynyl group, a phenylethynyl group, a maleimide group, a nadimide group, and a (meth)acryloyl group. The ethylenically unsaturated group is preferably a (meth)acryloyl group.

In the present embodiment, the component (A) contains "(A1) a photopolymerizable compound having an acidic substituent and an alicyclic structure together with an ethylenically unsaturated group" to be described later. When the component (A) contains the component (A1), a photosensitive resin composition which is excellent in resolution of via, adhesion strength to plated copper, electrical insulation reliability, and crack resistance is provided.

The component (A1) is hereinafter described in detail.

((A1) Photopolymerizable Compound Having Acidic Substituent and Alicylic Structure Together with Ethylenically Unsaturated Group)

Examples of the ethylenically unsaturated group in the component (A1) include the same groups as those for the ethylenically unsaturated group as mentioned above. Among these, the ethylenically unsaturated group is preferably at least one selected from the group consisting of a vinyl group, an allyl group, a propargyl group, a butenyl group, an ethynyl group, a phenylethynyl group, a maleimide group, a nadimide group, and a (meth)acryloyl group, more preferably a vinyl group, an allyl group, and a (meth)acryloyl group, and still more preferably a (meth)acryloyl group.

The acidic substituent in the component (A1) is preferably at least one selected from the group consisting of a carboxy group, a sulfonic acid group, a phenolic hydroxy group, and the like, and more preferably a carboxy group.

From the viewpoint of resolution of via, adhesion strength to plated copper, electrical insulation reliability, and crack resistance, the alicyclic structure in the component (A1) is preferably an alicyclic structure having 5 to 20 ring carbon atoms, more preferably an alicyclic structure having 5 to 18 ring carbon atoms, still more preferably an alicyclic structure having 6 to 18 ring carbon atoms, particularly preferably an alicyclic structure having 8 to 14 ring carbon atoms, and most preferably an alicyclic structure having 8 to 12 ring carbon atoms.

In addition, from the viewpoint of resolution of via, adhesion strength to plated copper, electrical insulation reliability, and crack resistance, the alicyclic structure is preferably composed of 2 or more rings, more preferably composed of 2 to 4 rings, and still more preferably composed of 3 rings. Examples of an alicyclic structure composed of one ring include a cyclohexane structure and a cyclohexene structure. Examples of the alicyclic structure composed of 2 or more rings include a norbornane structure, a decalin structure, a bicycloundecane structure, and a saturated dicyclopentadiene structure.

From the viewpoint of resolution of via, adhesion strength to plated copper, electrical insulation reliability, and crack resistance, the alicyclic structure is preferably a saturated dicyclopentadiene structure, and more preferably an alicyclic structure (saturated dicyclopentadiene structure) represented by the following general formula (a).

(a)

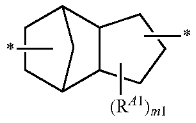

(In the general formula (a), $R^{A1}$ represents an alkyl group having 1 to 12 carbon atoms, and may be substituted at any site in the alicyclic structure. $m^1$ is an integer of 0 to 6. * is a site bonded to other structures.)

In the general formula (a), examples of the alkyl group having 1 to 12 carbon atoms, which is represented by $R^{A1}$, include a methyl group, an ethyl group, a n-propyl group, an isopropyl group, a n-butyl group, an isobutyl group, a t-butyl group, and a n-pentyl group. The alkyl group is preferably an alkyl group having 1 to 6 carbon atoms, more preferably an alkyl group having 1 to 3 carbon atoms, and still more preferably a methyl group.

$m^1$ is an integer of 0 to 6, preferably an integer of 0 to 2, and more preferably 0.

In the case where $m^1$ is an integer of 2 to 6, plural $R^{A1}$'s may be the same as or different from each other. Further, plural $R^{A1}$'s may be substituted on the same carbon atom within a possible range or may be substituted on different carbon atoms.

* is a site bonded to other structures, and bonding may be made by any carbon atom on the alicyclic structure, and is preferably made by the carbon atom expressed by 1 or 2 and the carbon atom expressed by 3 to 5 in the following general formula (a').

(a')

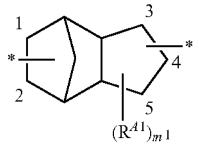

(In the general formula (a'), $R^{A1}$, $m^1$, and * are the same as those in the general formula (a)).

Examples of the component (A1) include:

"(A1-1) an acid-modified ethylenically unsaturated group and alicyclic structure-containing epoxy derivative" which is obtained by allowing a compound generated by modifying (a1) an alicyclic structure-containing epoxy resin with (a2) an ethylenically unsaturated group-containing organic acid [the foregoing compound is hereinafter occasionally referred to as a "component (A')"] to react with (a3) a saturated group or unsaturated group-containing polybasic acid anhydride; and "(A1-2) an acid-modified ethylenically unsaturated group and alicyclic structure-containing phenol novolak or cresol novolak resin" which is obtained by allowing a modified novolak type epoxy resin to react with (a2) an ethylenically unsaturated group-containing organic acid and (a4) an alicyclic structure-containing and saturated group or unsaturated group-containing polybasic acid anhydride, in which the modified novolak type epoxy resin is generated by subjecting at least one selected from the group consisting of ethylene oxide and propylene oxide, and a phenol novolak resin or a cresol novolak resin to addition polymerization.

The component (A1) is preferably the "acid-modified ethylenically unsaturated group and alicyclic structure-containing epoxy derivative (A1-1)" from the viewpoint of alkaline development and being excellent in resolution of via, adhesion strength to plated copper, electrical insulation reliability, and crack resistance.

First, raw materials for use in the production of the "acid-modified ethylenically unsaturated group and alicyclic structure-containing epoxy derivative (A1-1)" will be described in detail.

—(a1) Alicylic Structure-Containing Epoxy Resin—

The alicyclic structure-containing epoxy resin (a1) is preferably an epoxy resin having two or more epoxy groups. The epoxy resin is classified into a glycidyl ether type epoxy resin, a glycidyl amine type epoxy resin, and a glycidyl ester type epoxy resin. Among these, a glycidyl ether type epoxy resin is preferable.

In the present embodiment, at least an alicyclic structure-containing epoxy resin is used as the epoxy resin. The alicyclic structure is described in the same manner as in the alicyclic structure in the component (A1), and a preferable embodiment thereof is also the same.

The alicyclic structure-containing epoxy resin (a1) is preferably an epoxy resin represented by the following general formula (a1-1). In addition, an epoxy resin having a structural unit represented by the following general formula (a1-2) is also preferable.

(a1-1)

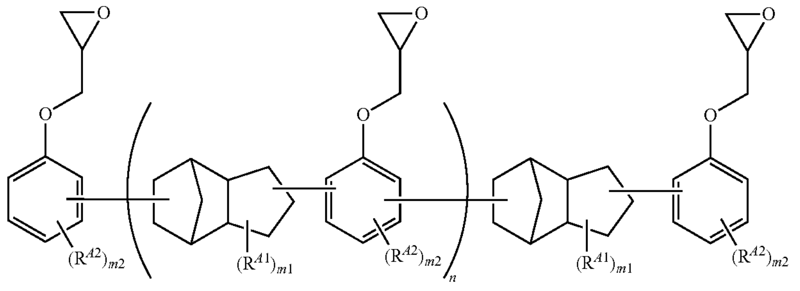

(In the general formula (a1-1), $R^{A1}$ represents an alkyl group having 1 to 12 carbon atoms and may be substituted at any site in the alicyclic structure. $R^{A2}$ represents an alkyl group having 1 to 12 carbon atoms. $m^1$ is an integer of 0 to 6, and $m^2$ is an integer of 0 to 3. n is 0 to 10.)

(a1-2)

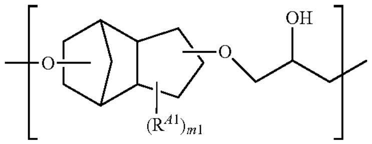

(In the general formula (a1-2), $R^{A1}$ represents an alkyl group having 1 to 12 carbon atoms and may be substituted at any site in the alicyclic structure. $m^1$ is an integer of 0 to 6.)

In the general formula (a1-1) and the general formula (a1-2), $R^{A1}$ is the same as $R^{A1}$ in the general formula (a), and a preferable embodiment thereof is also the same.

Examples of the alkyl group having 1 to 12 carbon atoms, which is represented by $R^{A2}$ in the general formula (a1-1), include a methyl group, an ethyl group, a n-propyl group, an isopropyl group, a n-butyl group, an isobutyl group, a t-butyl group, and a n-pentyl group. The alkyl group is preferably an alkyl group having 1 to 6 carbon atoms, more preferably an alkyl group having 1 to 3 carbon atoms, and still more preferably a methyl group.

$m^1$ in the general formula (a1-1) and the general formula (a1-2) is the same as $m^1$ in the general formula (a), and a preferable embodiment thereof is also the same.

$m^2$ in the general formula (a1-1) is an integer of 0 to 3, preferably 0 or 1, and more preferably 0.

n in the general formula (a1-1) represents a repeating number of the structural unit within the parenthesis and is 0 to 10. In general, since the epoxy resin is a mixture of compounds having different repeating numbers of the structural unit within the parenthesis, n is represented by an average value of the mixture in this case. n is preferably 2 to 10.

As the alicyclic structure-containing epoxy resin (a1), a commercially available product may be used. Examples of the commercially available product include XD-1000 (trade name, manufactured by Nippon Kayaku Co., Ltd.); and EPICLON HP-7200L, EPICLON HP-7200, EPICLON HP-7200E1H, and EPICLON HP-7200HHH (trade name, manufactured by DIC Corporation; "EPICLON" is a registered trademark).

As the epoxy resin (a1), an epoxy resin other than the epoxy resin having an alicyclic structure (hereinafter occasionally referred to as "other epoxy resin") may be used jointly. Examples of the other epoxy resin include: bisphenol-based epoxy resins, such as a bisphenol A type epoxy resin, a bisphenol F type epoxy resin, and a bisphenol S type epoxy resin; bisphenol-based novolak type epoxy resins, such as a bisphenol A novolak type epoxy resin and a bisphenol F novolak type epoxy resin; novolak type epoxy resins other than the bisphenol-based novolak type epoxy resins, such as a phenol novolak type epoxy resin, a cresol novolak type epoxy resin, and a biphenyl novolak type epoxy resin; phenol aralkyl type epoxy resins; biphenyl aralkyl type epoxy resins; stilbene type epoxy resins; naphthalene structure-containing type epoxy resins, such as a naphthalene type epoxy resin, a naphthol novolak type epoxy resin, a naphthol type epoxy resin, a naphthol aralkyl type epoxy resin, and a naphthylene ether type epoxy resin; biphenyl type epoxy resins; xylylene type epoxy resins; dihydroanthracene type epoxy resins; aliphatic chain epoxy resins; and rubber-modified epoxy resins.

—(a2) Ethylenically Unsaturated Group-Containing Organic Acid—

The ethylenically unsaturated group-containing organic acid (a2) is not particularly limited, and is preferably an ethylenically unsaturated group-containing monocarboxylic acid. The ethylenically unsaturated group is the same as the ethylenically unsaturated group described above for the component (A1).

Examples of the ethylenically unsaturated group-containing monocarboxylic acid include: acrylic acid; acrylic acid derivatives, such as a dimer of acrylic acid, methacrylic acid, β-furfurylacrylic acid, β-styrylacrylic acid, cinnamic acid, crotonic acid, and α-cyanocinnamic acid; a half ester compound that is a reaction product between a hydroxy group-containing acrylate and a dibasic acid anhydride; and a half ester compound that is a reaction product between an ethylenically unsaturated group-containing monoglycidyl ether or an ethylenically unsaturated group-containing monoglycidyl ester and a dibasic acid anhydride. Among these, acrylic acid is preferable.

The component (a2) may be used alone or may be used in combination of two or more thereof.

The half ester compound is obtained by, for example, allowing a hydroxy group-containing acrylate, an ethylenically unsaturated group-containing monoglycidyl ether, or an ethylenically unsaturated group-containing monoglycidyl ester to react with a dibasic acid anhydride in an equimolar ratio.

Examples of the hydroxy group-containing acrylate, the ethylenically unsaturated group-containing monoglycidyl ether, and the ethylenically unsaturated group-containing monoglycidyl ester, each of which is used for synthesis of the half ester compound that is an example of the component (a2), include hydroxyethyl acrylate, hydroxyethyl methacrylate, hydroxypropyl acrylate, hydroxypropyl methacrylate, hydroxybutyl acrylate, hydroxybutyl methacrylate, polyethylene glycol monoacrylate, polyethylene glycol monomethacrylate, trimethylolpropane diacrylate, trimethylolpropane dimethacrylate, pentaerythritol triacrylate, pentaerythritol trimethacrylate, dipentaerythritol pentaacrylate, dipentaerythritol pentamethacrylate, glycidyl acrylate, and glycidyl methacrylate.

The dibasic acid anhydride which is used for synthesis of the half ester compound may be either one containing a saturated group or one containing an unsaturated group. Examples of the dibasic acid anhydride include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride.

There is no particular limitation, and in the reaction between the component (a1) and the component (a2), it is preferable to perform the reaction in a ratio such that the component (a2) is 0.6 to 1.05 equivalents relative to 1 equivalent of the epoxy group of the component (a1), and the reaction may be performed such that the foregoing ratio is 0.8 to 1.0 equivalent. By performing the reaction in such a ratio, there is a tendency that the photopolymerizability is improved, namely the photosensitivity becomes large, and the resolution of via is improved.

The component (a1) and the component (a2) can be reacted in a state of being dissolved in an organic solvent.

Examples of the organic solvent include: ketones, such as methyl ethyl ketone and cyclohexanone; aromatic hydrocarbons, such as toluene, xylene, and tetramethylbenzene; glycol ethers, such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters, such as ethyl acetate, butyl acetate, butyl cellosolve acetate, and carbitol acetate; aliphatic hydrocarbons, such as octane and decane; and petroleum-based solvents, such as petroleum ether, petroleum naphtha, hydrogenated petroleum naphtha, and solvent naphtha.

Further, in order to promote the reaction between the component (a1) and the component (a2), it is preferable to use a catalyst. Examples of the catalyst include: amine-based catalysts, such as triethylamine and benzyl methylamine; quaternary ammonium salt catalysts, such as methyltriethylammonium chloride, benzyltrimethylammonium chloride, benzyltrimethylammonium bromide, and benzyltrimethylammonium iodide; and phosphine-based catalysts, such as triphenyl phosphine. Among these, phosphine-based catalysts are preferable, and triphenyl phosphine is more preferable.

A use amount of the catalyst is preferably 0.01 to 10 parts by mass, more preferably 0.05 to 5 parts by mass, and still more preferably 0.1 to 2 parts by mass based on 100 parts by mass of the total of the component (a1) and the component (a2). When the use amount falls within the range, there is a tendency that the reaction between the component (a1) and the component (a2) is promoted.

For the purpose of preventing polymerization during the reaction from occurring, it is preferable to use a polymerization inhibitor. Examples of the polymerization inhibitor include hydroquinone, methyl hydroquinone, hydroquinone monomethyl ether, catechol, and pyrogallol.

In the case of using the polymerization inhibitor, from the viewpoint of improving the storage stability of the composition, the use amount thereof is preferably 0.01 to 1 part by mass, more preferably 0.02 to 0.8 parts by mass, and still more preferably 0.05 to 0.5 parts by mass based on 100 parts by mass of the total of the component (a1) and the component (a2).

From the viewpoint of productivity, a reaction temperature between the component (a1) and the component (a2) is preferably 60° C. to 150° C., more preferably 70° C. to 120° C., and still more preferably 80° C. to 110° C.

In the light of the above, it may be conjectured that the component (A') which is obtained by allowing the component (a1) and the component (a2) to react with each other is one having a hydroxy group formed through a ring-opening addition reaction between the epoxy group of the component (a1) and the carboxy group of the component (a2).

—(a3) Polybasic Acid Anhydride—

The component (a3) may be one containing a saturated group or may be one containing an unsaturated group. Examples of the component (a3) include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride. Among these, tetrahydrophthalic anhydride is preferable from the viewpoint of resolution of via.

It may be conjectured that by further allowing the obtained component (A') to react with the component (a3) containing a saturated or unsaturated group, the acid-modified ethylenically unsaturated group and alicyclic structure-containing epoxy derivative (A1-1) in which the hydroxy group of the component (A') (also including the hydroxy group originally existing in the component (a1)) and an acid anhydride group of the component (a3) are half-esterified is formed.

In the reaction between the component (A') and the component (a3), for example, by reacting 0.1 to 1.0 equivalent of the compound (a3) relative to one equivalent of the hydroxy group in the component (A'), the acid value of the acid-modified ethylenically unsaturated group and alicyclic structure-containing epoxy derivative (A1-1) can be adjusted.

The acid value of the acid-modified ethylenically unsaturated group and alicyclic structure-containing epoxy derivative (A1-1) is preferably 20 mgKOH/g to 150 mgKOH/g, more preferably 30 mgKOH/g to 120 mgKOH/g, and still more preferably 40 mgKOH/g to 100 mgKOH/g. When the acid value is 20 mgKOH/g or more, there is a tendency that the solubility of the photosensitive resin composition in a dilute alkaline solution becomes excellent, and when the acid value is 150 mgKOH/g or less, there is a tendency that electrical characteristics of a cured film are improved.

From the viewpoint of productivity, a reaction temperature between the component (A') and the component (a3) is preferably 50° C. to 150° C., more preferably 60° C. to 120° C., and still more preferably 70° C. to 100° C.

In the light of the above, the photopolymerizable compound (A1) having an acidic substituent and an alicyclic structure together with an ethylenically unsaturated group is not particularly limited, and is preferably represented by the following general formula (A-1).

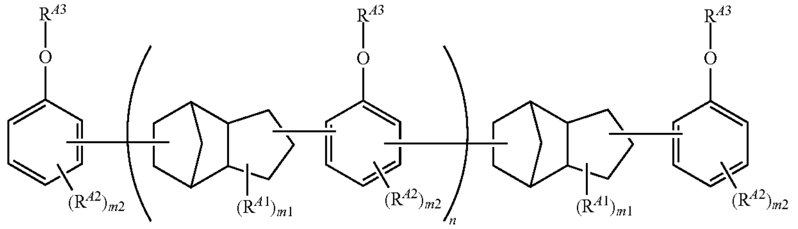

(A-1)

(In the general formula (A-1), $R^{A1}$ represents an alkyl group having 1 to 12 carbon atoms and may be substituted at any site in the alicyclic structure. $R^{A2}$ represents an alkyl group having 1 to 12 carbon atoms. $R^{A3}$ is an organic group having an ethylenically unsaturated group, an organic group having an ethylenically unsaturated group and an acidic substituent, or a glycidyl group, and at least one $R^{A3}$ is an organic group having an ethylenically unsaturated group and an acidic substituent. $m^1$ is an integer of 0 to 6, and $m^2$ is an integer of 0 to 3. n is 0 to 10.)

In the general formula (A-1), $R^{A1}$, $R^{A2}$, $m^1$, $m^2$, and n are the same as those in the general formula (a1-1), and preferable embodiments thereof are also the same.

$R^{A3}$ is the same as defined above, and the glycidyl group in the general formula (a1-1) is corresponding to the site formed through the reaction between the component (a2) and the component (a3) and is defined taking into consideration the matter that a part of the glycidyl group is unreacted. Namely, the "organic group having an ethylenically unsaturated group" that is a choice for $R^{A3}$ is a group derived from the component (a2), and the "organic group having an ethylenically unsaturated group and an acidic substituent" is a group derived from the components (a2) and (a3). When the components (a2) and (a3) react with all of the glycidyl groups in the general formula (a1-1), $R^{A3}$ becomes the "organic group having an ethylenically unsaturated group and an acidic substituent", the site which reacts with only the component (a2) becomes the "organic group having an ethylenically unsaturated group", and the site which does not react with any of the components (a2) and (a3) becomes the "glycidyl group".

Next, raw materials that can be used in the production of the "acid-modified ethylenically unsaturated group and alicyclic structure-containing phenol novolak or cresol novolak resin (A1-2)" will be briefly described.

One of the raw materials is a modified novolak type epoxy resin generated by subjecting at least one selected from the group consisting of ethylene oxide and propylene oxide, and a phenol novolak resin or a cresol novolak resin to addition polymerization. A catalyst is preferably used for the addition polymerization, and examples of the catalyst include metallic sodium, sodium methoxide, sodium hydroxide, potassium hydroxide, sodium carbonate, potassium carbonate, sodium phenolate, and various Lewis acids.

A weight average molecular weight of the phenol novolak resin or the cresol novolak resin is not particularly limited, and is preferably 500 to 30,000, and more preferably 1,000 to 10,000. In the present description, the weight average molecular weight (and a number average molecular weight) are values obtained in terms of standard polystyrene by gel permeation chromatography (GPC) using tetrahydrofuran as a solvent, and more specifically, values measured according to a method to be described later.

The reaction temperature is not particularly limited, and can fall within the range of 60° C. to 230° C.

The addition polymerization may be performed by using or applying a known method, and the method is not limited.

A modified novolak type epoxy resin can be obtained by the addition polymerization.

The "ethylenically unsaturated group-containing organic acid (a2)" to be reacted with the obtained modified novolak type epoxy resin is described in the same manner as the ethylenically unsaturated group-containing organic acid (a2) described above.

Further, the alicyclic structure in the "alicyclic structure-containing and saturated group or unsaturated group-containing polybasic acid anhydride (a4)" to be reacted with the obtained modified novolak type epoxy resin is preferably an alicyclic structure having 5 to 20 ring carbon atoms, more preferably an alicyclic structure having 5 to 15 ring carbon atoms, still more preferably an alicyclic structure having 5 to 10 ring carbon atoms, and particularly preferably an alicyclic structure having 5 to 8 ring carbon atoms. The alicyclic structure may have one ring, or may have two or more rings, and preferably has one ring. The alicyclic structure is preferably a cyclohexane structure or a cyclohexene structure, and more preferably a cyclohexene structure.

Examples of the "alicyclic structure-containing and saturated group or unsaturated group-containing polybasic acid anhydride (a4)" include tetrahydrophthalic anhydride, phthalic anhydride, methyltetrahydrophthalic anhydride, ethyltetrahydrophthalic anhydride, hexahydrophthalic anhydride, methylhexahydrophthalic anhydride, and ethylhexahydrophthalic anhydride. Among these, tetrahydrophthalic anhydride and phthalic anhydride are preferable, and tetrahydrophthalic anhydride is more preferable.

There is no particular limitation on conditions for reacting the ethylenically unsaturated group-containing organic acid (a2) and the alicyclic structure-containing and saturated group or unsaturated group-containing polybasic acid anhydride (a4) with the modified novolak type epoxy resin, and for example, a method in which the component (a2) is reacted at 20° C. to 100° C. in the presence of a catalyst as necessary, and then the component (a4) is reacted at 20° C. to 100° C. is used.

(Molecular Weight of Photopolymerizable Compound (A1) Having Acidic Substituent and Alicylic Structure Together with Ethylenically Unsaturated Group)

A weight average molecular weight (Mw) of the component (A1) is preferably 1,000 to 30,000, more preferably 2,000 to 25,000, and still more preferably 3,000 to 18,000. When the weight average molecular weight falls within the range, the adhesion strength to plated copper, the heat resistance, and the electrical insulation reliability are improved. In particular, it is preferable that the weight average molecular weight (Mw) of the acid-modified ethylenically unsaturated group and alicyclic structure-containing epoxy derivative (A1-1) falls within the range. Here, the weight average molecular weight (and the number average molecular weight) are values measured using a calibration curve of standard polystyrene with gel permeation chromatography (GPC) (manufactured by Tosoh Corporation), and in more detail, values measured according to a method described below.

<Method of Measuring Weight Average Molecular Weight and Number Average Molecular Weight>

As for the weight average molecular weight and the number average molecular weight, a value obtained by performing the measurement using a GPC measurement apparatus as described below and under measurement conditions as described below and converting a measured value using a calibration curve of standard polystyrene is defined as the weight average molecular weight or the number average molecular weight. In addition, for preparing the calibration curve, 5 sample sets of standard polystyrene ("PStQuick MP-H" and "PStQuick B", manufactured by Tosoh Corporation) are used.

(GPC Measurement Apparatus)

GPC device: High-speed GPC device "HCL-8320GPC", with a differential refractometer detector or a UV detector as the detector, manufactured by Tosoh Corporation Column: Column TSKgel SuperMultipore HZ-H (column length: 15 cm, column inner diameter: 4.6 mm), manufactured by Tosoh Corporation (Measurement Condition)

Solvent: Tetrahydrofuran (THF)

Measurement temperature: 40° C.

Flow rate: 0.35 mL/min

Sample concentration: 10 mg/5 mL of THF

Injection volume: 20 μL ((A2-1) Acid-modified Ethylenically Unsaturated Group-containing Epoxy Derivative Not Containing Alicylic Structure)

The photopolymerizable compound (A) having an ethylenically unsaturated group may also be an embodiment further including "(A2-1) an acid-modified ethylenically unsaturated group-containing epoxy derivative not containing an alicyclic structure" which is obtained by allowing a compound generated by modifying (a21) an epoxy resin (not containing an alicyclic structure) with (a22) an ethylenically unsaturated group-containing organic acid to react with (a23) a saturated group or unsaturated group-containing polybasic acid anhydride.

The epoxy resin (a21) is not particularly limited as long as it is an epoxy resin not containing an alicyclic structure, and examples thereof include a glycidyl ether type epoxy resin, a glycidyl amine type epoxy resin, and a glycidyl ester type epoxy resin. Among these, a glycidyl ether type epoxy resin is preferable.

The epoxy resin (a21) is classified into various epoxy resins depending upon a difference of a main structure, and in the epoxy resins of respective types, the epoxy resin is further classified as follows. Specifically, the epoxy resin is classified into: bisphenol-based epoxy resins, such as a bisphenol A type epoxy resin, a bisphenol F type epoxy resin, and a bisphenol S type epoxy resin; bisphenol-based novolak type epoxy resins, such as a bisphenol A novolak type epoxy resin and a bisphenol F novolak type epoxy resin; novolak type epoxy resins other than the bisphenol-based novolak type epoxy resins, such as a phenol novolak type epoxy resin, a cresol novolak type epoxy resin, and a biphenyl novolak type epoxy resin; phenol aralkyl type epoxy resins; stilbene type epoxy resins; naphthalene structure-containing type epoxy resins, such as a naphthalene type epoxy resin, a naphthol novolak type epoxy resin, a naphthol type epoxy resin, a naphthol aralkyl type epoxy resin, and a naphthylene ether type epoxy resin; biphenyl type epoxy resins; biphenyl aralkyl type epoxy resins; xylylene type epoxy resins; dihydroanthracene type epoxy resins; aliphatic chain epoxy resins; rubber-modified epoxy resins; and the like. Among these, bisphenol-based novolak type epoxy resins are preferable, and a bisphenol F novolak type epoxy resin is more preferable.

The ethylenically unsaturated group-containing organic acid (a22) and the saturated group or unsaturated group-containing polybasic acid anhydride (a23) are the same as those described above for the ethylenically unsaturated group-containing organic acid (a2) and the saturated group or unsaturated group-containing polybasic acid anhydride (a3), and preferable embodiments thereof are also the same.

As a method for allowing the compound generated by modifying the component (a21) with the component (a22) to react with the component (a23), the method for allowing the compound generated by modifying the component (a1) with the component (a2) to react with the component (a3) can be made by reference.

As the acid-modified ethylenically unsaturated group-containing epoxy derivative not containing an alicyclic structure (A2-1), a commercially available product may be used. Examples of the commercially available product include CCR-121811, CCR-115911, CCR-122211, PCR-1050, TCR-133511, ZAR-1035, ZAR-200111, UXE-3024, ZFR-1185, ZCR-156911, ZXR-1807, ZCR-6000, and ZCR-8000 (trade name, all manufactured by Nippon Kayaku Co., Ltd.), and UE-9000, UE-EXP-2810PM, and UE-EXP-3045 (trade name, all manufactured by DIC Corporation).

In the case where the component (A) contains both the component (A1) (or the component (A1-1)) and the component (A2-1), from the viewpoint of a balance among characteristics, such as resolution of via, adhesion strength to plated copper, electrical insulation reliability, and crack resistance, a content ratio of the component (A1) (or the component (A1-1)) to the component (A2-1), [(A1) or (A1-1)/(A2-1)] is preferably 20/80 to 99/1, more preferably 50/50 to 99/1, still more preferably 60/40 to 99/1, particularly preferably 60/40 to 85/15, and most preferably 65/35 to 80/20 in terms of a mass ratio.

((A2-2) Styrene-Maleic Acid-Based Resin)

As the photopolymerizable compound (A) having an ethylenically unsaturated group, "(A2-2) a styrene-maleic acid-based resin", such as a hydroxyethyl (meth)acrylate modified product of a styrene-maleic anhydride copolymer, can also be used jointly. The component (A2-2) does not contain an alicyclic structure. The component (A2-2) may be used alone or may be used in combination of two or more thereof.

((A2-3) Epoxy-Based Polyurethane Resin)

As the photopolymerizable compound (A) having an ethylenically unsaturated group, "(A2-3) an epoxy-based polyurethane resin" which is obtained by allowing a compound generated by modifying the epoxy resin (a21) with the ethylenically unsaturated group-containing organic acid (a22) to react with an isocyanate compound can also be used jointly. Examples of the compound generated by modifying the epoxy resin (a21) with the ethylenically unsaturated group-containing organic acid (a22) include the component (A') which is a compound generated by modifying the alicyclic structure-containing epoxy resin (a1) with the ethylenically unsaturated group-containing organic acid (a2).

The component (A2-3) does not contain an alicyclic structure. The component (A2-3) may be used alone or may be used in combination of two or more thereof.

(Other Component (A) than Those Described Above)

As for the photopolymerizable compound (A) having an ethylenically unsaturated group, from the viewpoint of enhancing the chemical resistance after curing (exposure) to make a difference in developer resistance between an exposed area and an unexposed area large, the photopolymerizable compound (A) having an ethylenically unsaturated group is preferably an embodiment including at least one selected from the group consisting of (Ai) a monofunctional vinyl monomer having one polymerizable ethylenically unsaturated group, (Ail) a bifunctional vinyl monomer having two polymerizable ethylenically unsaturated groups, and (Aiii) a polyfunctional vinyl monomer having at least three polymerizable ethylenically unsaturated groups, and more preferably an embodiment including the component (Aiii). The components (Ai) to (Aiii) are preferably ones each having a molecular weight of 1,000 or less. However, in the present embodiment, the components (Ai) to (Aiii) do not include the component (A1).

((Ai) Monofunctional Vinyl Monomer)

Examples of the monofunctional vinyl monomer having one polymerizable ethylenically unsaturated group include (meth)acrylic acid and a (meth)acrylic acid alkyl ester. Examples of the (meth)acrylic acid alkyl ester include methyl (meth)acrylate, ethyl (meth)acrylate, butyl (meth) acrylate, 2-ethylhexyl (meth)acrylate, and hydroxyethyl (meth)acrylate. The component (Ai) may be used alone or may be used in combination of two or more thereof.

((Aii) Bifunctional Vinyl Monomer)

Examples of the bifunctional vinyl monomer having two polymerizable ethylenically unsaturated groups include polyethylene glycol di(meth)acrylate, trimethylolpropane di(meth)acrylate, polypropylene glycol di(meth)acrylate, 2,2-bis(4-(meth)acryloxypolyethoxypolypropoxyphenyl) propane, and bisphenol A diglycidyl ether di(meth)acrylate. The component (Aii) may be used alone or may be used in combination of two or more thereof.

((Aiii) Polyfunctional Vinyl Monomer)

Examples of the polyfunctional vinyl monomer having at least three polymerizable ethylenically unsaturated groups include: (meth)acrylate compounds having a trimethylolpropane-derived structure, such as trimethylolpropane tri(meth) acrylate; (meth)acrylate compounds having a tetramethylolmethane-derived structure, such as tetramethylolmethane tri(meth)acrylate and tetramethylolmethane tetra(meth)acrylate; (meth)acrylate compounds having a pentaerythritol-derived structure, such as pentaerythritol tri(meth)acrylate and pentaerythritol tetra(meth)acrylate; (meth)acrylate compounds having a dipentaerythritol-derived structure, such as dipentaerythritol penta(meth)acrylate and dipentaerythritol hexa(meth)acrylate; (meth)acrylate compounds having a ditrimethylolpropane-derived structure, such as ditrimethylolpropane tetra(meth)acrylate; and (meth)acrylate compounds having a diglycerin-derived structure. Among these, from the viewpoint of enhancing the chemical resistance after curing (exposure) to make a difference in developer resistance between an exposed area and an unexposed area large, (meth)acrylate compounds having a dipentaerythritol-derived structure are preferable, and dipentaerythritol penta (meth)acrylate is more preferable. The component (Aiii) may be used alone or may be used in combination of two or more thereof.

Here, the expression "(meth)acrylate compound having an XXX-derived structure" ("XXX" is a compound name) means an esterified product between XXX and (meth)acrylic acid, and a compound modified with an alkylene oxy group is also included in the foregoing esterified product.

(Content of Component (A))

The content of the component (A) is not particularly limited, and from the viewpoint of heat resistance, electrical characteristics, and chemical resistance, is preferably 60% by mass or less, more preferably 0.1% to 55% by mass, still more preferably 1% to 50% by mass, particularly preferably 2% to 40% by mass, and most preferably 3% to 37% by mass, and may be 5% to 37% by mass, or 15% to 37% by mass, or 20% to 37% by mass, on the basis of the total amount of the solid components in the photosensitive resin composition.

The component (A) is not particularly limited, and from the viewpoint of photosensitive characteristics, it is preferable to use the component (A1) in combination with the component (Aiii). In this case, a content proportion [(A1)/(Aiii)] (mass ratio) of the component (A1) to the component (Aiii) is preferably 2 to 20, more preferably 2 to 15, still more preferably 2.5 to 10, and particularly preferably 3 to 6.

From the viewpoint of resolution of via, adhesion strength to plated copper, electrical insulation reliability, and crack resistance, a content ratio of the component (A1) to the total amount of the component (A) is preferably 20% to 95% by mass, more preferably 40% to 95% by mass, still more preferably 65% to 95% by mass, and particularly preferably 80% to 95% by mass.

<(X) Organic Particles>

Since the photosensitive resin composition according to the present embodiment contains the organic particles (X), the adhesiveness to plated copper, the electrical insulation reliability, and the crack resistance can be improved while maintaining the resolution of via at a high level. As the electrical insulation reliability, particularly, electrical insulation reliability after moisture absorption (HAST resistance) is improved.

The organic particles (X) are present in the form of particles in the photosensitive resin composition. Regarding the organic particles (X), a ratio of a major axis r2 to a minor axis r1 (r2/r1) is preferably 1.4 or less, more preferably 1.2 or less, and still more preferably 1.1 or less. The ratio (r2/r1) is an average value of any 10 particles.

The minor axis r1 and the major axis r2 of the organic particles (X) are values measured by a laser diffraction/scattering type particle size distribution analyzer (for example, LS13320 manufactured by Beckman Coulter, Inc.). In addition, the method of measuring the minor axis r1 and the major axis r2 of the organic particles can also be substituted by observation using a scanning electron microscope (SEM).

The organic particles (X) are not particularly limited as long as the organic particles contain an organic substance as a main component. Here, the organic substance as the main component means that the proportion of the organic substance in the total mass of the particles is 50% by mass or more, and the proportion of the organic substance in the total mass of the particles is preferably 80% by mass or more, more preferably 90% by mass or more, and still more preferably substantially 100% by mass.

It is preferable that the component (organic substance) constituting the organic particles (X) contains at least one selected from the group consisting of a polyethylene, a polybutadiene, a polystyrene, an acrylonitrile-butadiene copolymer, an acrylonitrile-butadiene-styrene copolymer, a styrene-butadiene copolymer, a styrene-divinylbenzene copolymer, a (meth)acrylic acid ester copolymer, a silicone rubber, polyvinyl alcohol, an epoxy resin, a polyester, a polyamide, a polyimide, a polyamideimide, a polyurethane, polyphenylene ether, and a melamine resin.

The organic particles (X) may be particles having a cross-linked structure, or may be particles not having a cross-linked structure.

The organic particles (X) used in the present embodiment are preferably particles that are easily dropped or easily dissolved during a desmear treatment, and from this viewpoint, the organic particles (X) preferably contain core-shell particles. Here, the core-shell particles are polymer particles whose cores and shells have different photosensitive properties, and in the present embodiment, the cores and the shells of the particles are preferably composed of different components. In the case where the organic particles (X) contain core-shell particles, the content of the core-shell particles is not particularly limited, and is preferably 5% by mass or more, more preferably 20% by mass or more, still more preferably 50% by mass or more, particularly preferably 80% by mass or more, most preferably 95% by mass or more, and may be substantially 100% by mass in the organic particles (X) from the viewpoint of ease of dropping or ease of dissolution during the desmear treatment.

The core-shell particles are not particularly limited, and are preferably formed of the component constituting the organic particles (X) as described above. The components constituting portions of the cores and the shells are more preferably a resin having low desmear resistance, excellent softness, and excellent compatibility and dispersibility, and examples of such a resin include an epoxy resin, a butadiene rubber, a styrene-butadiene copolymer, a polyamide resin, and a (meth)acrylic acid ester copolymer. Among these, the resin is preferably an epoxy resin, a styrene-butadiene copolymer, and a (meth)acrylic acid ester copolymer. The component constituting the cores is preferably a styrene-butadiene copolymer since the adhesion strength to plated copper is further improved.

Examples of a combination (core/shell) of the component constituting the cores and the component constituting the shells include styrene-butadiene copolymer/(meth)acrylic acid ester copolymer, (meth)acrylic acid ester copolymer/epoxy resin, epoxy resin/silicone rubber, acrylonitrile-butadiene copolymer/(meth)acrylic acid ester copolymer, polyethylene/(meth)acrylic acid ester copolymer, polybutadiene/(meth)acrylic acid ester copolymer, or polyester/(meth)acrylic acid ester copolymer. Among these, styrene-butadiene copolymer/(meth)acrylic acid ester copolymer and (meth)acrylic acid ester copolymer/epoxy resin are preferable.

In the component constituting the organic particles (X), the component constituting the cores, and the component constituting the shells, examples of the (meth)acrylic acid ester copolymer include an acrylic acid ester-methacrylic acid ester copolymer, a methacrylic acid ester-styrene copolymer, and an acrylic acid ester copolymer. Examples of an ester moiety in the (meth)acrylic acid ester include an alkyl ester having 1 to 12 carbon atoms of an alkyl group or the like, a cycloalkyl ester having 3 to 12 ring carbon atoms of a cycloalkyl group or the like, an aryl ester having 6 to 18 ring carbon atoms of a phenyl group or the like, an aralkyl group such as a benzyl group, and a hetero group in which a part of these groups is substituted with a hetero atom.

Examples of the acrylic acid ester include methyl acrylate, ethyl acrylate, n-propyl acrylate, isopropyl acrylate, n-butyl acrylate, isobutyl acrylate, s-butyl acrylate, t-butyl acrylate, n-hexyl acrylate, 2-ethylhexyl acrylate, n-octyl acrylate, n-lauryl acrylate, 2-hydroxyethylhexyl acrylate, cyclohexyl acrylate, isobornyl acrylate, tetrahydrofuryl acrylate, benzyl acrylate, and phenyl acrylate. Among these, the acrylic acid ester is preferably methyl acrylate, ethyl acrylate, n-propyl acrylate, and isopropyl acrylate, and more preferably methyl acrylate and ethyl acrylate.

Examples of the methacrylic acid ester include methyl methacrylate, ethyl methacrylate, n-propyl methacrylate, isopropyl methacrylate, n-butyl methacrylate, isobutyl methacrylate, s-butyl methacrylate, t-butyl methacrylate, n-hexyl methacrylate, cyclohexyl methacrylate, 2-ethylhexyl methacrylate, pentadecyl methacrylate, dodecyl methacrylate, isobornyl methacrylate, phenyl methacrylate, benzyl methacrylate, phenoxyethyl methacrylate, 2-hydroxyethyl methacrylate, 2-methoxyethyl methacrylate, glycidyl methacrylate, and allyl methacrylate. Among these, the methacrylic acid ester is preferably methyl methacrylate, ethyl methacrylate, n-propyl methacrylate, and isopropyl methacrylate, and more preferably methyl methacrylate and ethyl methacrylate.

Similarly, in the component constituting the organic particles (X), the component constituting the cores, or the component constituting the shells, the epoxy resin is preferably a glycidyl ether type or glycidyl amine type epoxy resin, any of which may be used, and more preferably a glycidyl ether type epoxy resin.

Examples of the epoxy resin preferably include: bisphenol-based epoxy resins, such as a bisphenol A type epoxy resin, a bisphenol F type epoxy resin, and a bisphenol S type epoxy resin; bisphenol-based novolak type epoxy resins, such as a bisphenol A novolak type epoxy resin and a bisphenol F novolak type epoxy resin; novolak type epoxy resins other than the bisphenol-based novolak type epoxy resins, such as a phenol novolak type epoxy resin, a cresol novolak type epoxy resin, and a biphenyl novolak type epoxy resin; phenol aralkyl type epoxy resins; stilbene type epoxy resins; naphthalene structure-containing type epoxy resins, such as a naphthalene type epoxy resin, a naphthol novolak type epoxy resin, a naphthol type epoxy resin, a naphthol aralkyl type epoxy resin, and a naphthylene ether type epoxy resin; biphenyl type epoxy resins; biphenyl aralkyl type epoxy resins; xylylene type epoxy resins; dihydroanthracene type epoxy resins; alicyclic epoxy resins such as a dicyclopentadiene type epoxy resin; heterocylic epoxy resins; spiro ring-containing epoxy resins; cyclohexane dimethanol type epoxy resins; trimethylol type epoxy resins; aliphatic chain epoxy resins; and rubber-modified epoxy resins. Among these, preferred are bisphenol-based novolak type epoxy resins, such as a bisphenol A type epoxy resin, a bisphenol F type epoxy resin, a bisphenol A novolak type epoxy resin, and a bisphenol F novolak type epoxy resin, and novolak type epoxy resins other than the bisphenol-based novolak type epoxy resins, such as a phenol novolak type epoxy resin and a cresol novolak type epoxy resin.

The core-shell particles may be prepared by a common method, for example, an emulsion polymerization method, a seed polymerization method, a microsuspension polymerization method, or a suspension polymerization method, and a commercially available product may be used.

Examples of the commercially available product of the core-shell particles include: EXL2620, EXL2650, EXL2655, TMS-2670, BTA-717, and BTA-731 (all manufactured by Dow Corning Toray Co. Ltd.), which are Paraloid (registered trademark) series; and MX-153, MX-128, MX-139, MX-257, MX-136, and MX-217 (all manufactured by Kaneka Corporation), which are MX series of KANE ACE (registered trademark).

From the viewpoint of resolution of via and a surface shape after the desmear treatment, as an average particle diameter of the organic particles (X), an average value of primary particle diameters (volume average particle diameter) is preferably 0.5 μm or less, more preferably 0.01 μm to 0.5 μm, still more preferably 0.01 μm to 0.2 μm, and may be 0.01 μm to 0.15 μm, or may be 0.01 μm to 0.10 μm. The same applies to an average particle diameter of the core-shell particles. In the present description, the average value of the primary particle diameters (volume average particle diameter) is a particle diameter at an integrated value of 50% (volume basis) in a particle size distribution obtained by measuring particles dispersed in a solvent at a refractive index of 1.38 in accordance with International Standard ISO13321, using a zeta potential and particle size distribution analyzer (manufactured by Beckman Coulter, Inc.).

(Content of Component (X))

The content of the organic particles (X) is not particularly limited. The content is preferably 1% to 60% by mass, and more preferably 3% to 50% by mass from the viewpoint of resolution of via, adhesion strength to plated copper, electrical insulation reliability, and crack resistance, the content is still more preferably 5% to 40% by mass, and particularly preferably 7% to 35% by mass further from the viewpoint of more sufficient crack resistance, and the content is most preferably 8% to 20% by mass further from the viewpoint of more sufficient resolution of via, on the basis of the total amount of the solid components in the photosensitive resin composition.

<(B) Photopolymerization Initiator>

The component (B) used in the present embodiment is not particularly limited as long as it is able to polymerize the component (A), and it can be appropriately selected from typically used photopolymerization initiators.

Examples of the component (B) include: benzoin compounds, such as benzoin, benzoin methyl ether, and benzoin isopropyl ether; acetophenone compounds, such as acetophenone, 2,2-dimethoxy-2-phenylacetophenone, 2,2-diethoxy-2-phenylacetophenone, 1,1-dichloroacetophenone, 1-hydroxycyclohexylphenyl ketone, 2-benzyl-2-dimethylamino-1-(4-morpholinophenyl)-1-butanone, 2-methyl-1-[4-(methylthio)phenyl]-2-morpholino-1-propanone, and N,N-dimethylaminoacetophenone; anthraquinone compounds, such as 2-methylanthraquinone, 2-ethylanthraquinone, 2-tert-butylanthraquinone, 1-chloroanthraquinone, 2-amylanthraquinone, and 2-aminoanthraquinone; thioxanthone compounds, such as 2,4-dimethylthioxanthone, 2,4-diethylthioxanthone, 2-chlorothioxanthone, and 2,4-diisopropylthioxanthone; ketal compounds, such as acetophenone dimethyl ketal and benzyldimethyl ketal; benzophenone compounds, such as benzophenone, methylbenzophenone, 4,4'-dichlorobenzophenone, 4,4'-bis(diethylamino)benzophenone, Michler's ketone, and 4-benzoyl-4'-methyldiphenyl sulfide; acridine compounds, such as 9-phenylacridine and 1,7-bis(9,9'-acridinyl)heptane; acyl phosphine oxide compounds, such as 2,4,6-trimethylbenzoyldiphenyl phosphine oxide; and oxime ester compounds, such as 1,2-octanedione-1-[4-(phenylthio)phenyl]-2-(O-benzoyloxime), 1-[9-ethyl-6-(2-methylbenzoyl)-9H-carbazol-3-yl]ethanone 1-(O-acetyloxime), and 1-phenyl-1,2-propanedione-2-[O-(ethoxycarbonyl)oxime]. Among these, acetophenone compounds and thioxanthone compounds are preferable, and 2-methyl-1-[4-(methylthio)phenyl]-2-morpholino-1-propanone and 2,4-diethylthioxanthone are more preferable. The acetophenone compounds have an advantage of being hardly volatilized and hardly generated as an outgas, and the thioxanthone compounds have an advantage of being able to be photo-cured even in a visible light region.

The component (B) may be used alone or may be used in combination of two or more thereof. In the case of using two or more compounds in combination, it is preferable to use an acetophenone compound and a thioxanthone compound in combination, and it is more preferable to use 2-methyl-1-[4-(methylthio)phenyl]-2-morpholino-1-propanone and 2,4-diethylthioxanthone in combination.

(Content of Component (B))

The content of the component (B) is not particularly limited, and is preferably 0.1% to 15% by mass, more preferably 0.15% to 5% by mass, still more preferably 0.15% to 1.5% by mass, and particularly preferably 0.20% to 0.8% by mass on the basis of the total amount of the solid components in the photosensitive resin composition. When the content of the component (B) is 0.1% by mass or more, in an interlayer insulating layer formed using the photosensitive resin composition, there is a tendency that a risk in which an exposed site eluates during the development is reduced, and when the content is 15% by mass or less, there is a tendency that the heat resistance is improved.

<(B') Photopolymerization Initiator>

The photosensitive resin composition according to the present embodiment may contain (B') a photopolymerization initiator together with the component (B). Examples of the photopolymerization initiator (B') include tertiary amine compounds, such as ethyl N,N-dimethylaminobenzoate, isoamyl N,N-dimethylaminobenzoate, pentyl-4-dimethylaminobenzoate, triethylamine, and triethanolamine. The component (B') may be used alone or may be used in combination of two or more thereof.

In the case where the photosensitive resin composition according to the present embodiment contains the component (B'), the content thereof is preferably 0.01% to 20% by mass, more preferably 0.2% to 5% by mass, and still more preferably 0.3% to 2% by mass on the basis of the total amount of the resin components in the photosensitive resin composition. The photosensitive resin composition according to the present embodiment may not contain the component (B').

<(C) Thermosetting Resin>

The photosensitive resin composition according to the present embodiment may further contain a thermosetting resin as the component (C), and the thermosetting resin is preferably contained. A compound corresponding to the component (A) is not included in the component (C), and in this respect, it may be said that the component (C) does not have an ethylenically unsaturated group. In addition, a substance of not only satisfying the requirement of not having an ethylenically unsaturated group, but also having an epoxy group (such as epoxy-modified polybutadiene) is included in the component (C). Further, since the component (C) is not in the form of particles, the component (C) does not include the organic particles (X) described above.

When the photosensitive resin composition according to the present embodiment contains the thermosetting resin (C), in addition to improvement in adhesion strength to plated copper and insulation reliability, there is a tendency that the heat resistance is improved.

Examples of the thermosetting resin include an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin. In addition, the thermosetting resin is not particularly limited to these resins, and known thermosetting resins can be used. Among these, an epoxy resin is preferable.

The component (C) may be used alone or may be used in combination of two or more thereof.

The epoxy resin is preferably an epoxy resin having two or more epoxy groups. The epoxy resin is classified into a glycidyl ether type epoxy resin, a glycidyl amine type epoxy resin, and a glycidyl ester type epoxy resin. Among these, a glycidyl ether type epoxy resin is preferable.

The epoxy resin is classified into various epoxy resins depending upon a difference of the main structure, and in the epoxy resins of respective types, the epoxy resin is further classified as follows. Specifically, the epoxy resin is classified into: bisphenol-based epoxy resins, such as a bisphenol A type epoxy resin, a bisphenol F type epoxy resin, and a bisphenol S type epoxy resin; bisphenol-based novolak type epoxy resins, such as a bisphenol A novolak type epoxy resin and a bisphenol F novolak type epoxy resin; novolak type epoxy resins other than the bisphenol-based novolak type epoxy resins, such as a phenol novolak type epoxy resin, a cresol novolak type epoxy resin, and a biphenyl novolak type epoxy resin; phenol aralkyl type epoxy resins; stilbene type epoxy resins; naphthalene structure-containing type epoxy resins, such as a naphthalene type epoxy resin, a naphthol novolak type epoxy resin, a naphthol type epoxy resin, a naphthol aralkyl type epoxy resin, and a naphthylene ether type epoxy resin; biphenyl type epoxy resins; biphenyl aralkyl type epoxy resins; xylylene type epoxy resins; dihydroanthracene type epoxy resins; alicyclic epoxy resins such as a dicyclopentadiene type epoxy resin; heterocylic epoxy resins; spiro ring-containing epoxy resins; cyclohexane dimethanol type epoxy resins; trimethylol type epoxy resins; aliphatic chain epoxy resins; rubber-modified epoxy resins; and the like.

The component (C) may be used alone or may be used in combination of two or more thereof.

Among these, in particular, from the viewpoint of heat resistance, electrical insulation reliability, and adhesion strength to plated copper, bisphenol-based epoxy resins, naphthol type epoxy resins, naphthalene type epoxy resins, biphenyl type epoxy resins, naphthylene ether type epoxy resins, and cresol novolak type epoxy resins are preferable, a bisphenol A type epoxy resin, a bisphenol F type epoxy resin, and a biphenyl type epoxy resin are more preferable, a bisphenol F type epoxy resin and a biphenyl type epoxy resin are still more preferable, and a biphenyl type epoxy resin is particularly preferable.

As for these, commercially available products can be used. Examples thereof include a bisphenol A type epoxy resin ("jER828EL" and "YL980", manufactured by Mitsubishi Chemical Corporation), a bisphenol F type epoxy resin ("jER806H" and "YL983U", manufactured by Mitsubishi Chemical Corporation), a naphthalene type epoxy resin ("HP4032D" and "HP4710", manufactured by DIC Corporation), a naphthalene structure-containing type polyfunctional epoxy resin ("NC7000", manufactured by Nippon Kayaku Co., Ltd.), a naphthol type epoxy resin ("ESN-475V", manufactured by NIPPON STEEL Chemical & Material Co., Ltd.), an epoxy resin having a biphenyl structure ("NC3000H" and "NC3500", manufactured by Nippon Kayaku Co., Ltd., and "YX4000HK" and "YL6121", manufactured by Mitsubishi Chemical Corporation), an anthracene type epoxy resin ("YX8800", manufactured by Mitsubishi Chemical Corporation), a glycerol type epoxy resin ("ZX1542", manufactured by NIPPON STEEL Chemical & Material Co., Ltd.), a naphthylene ether type epoxy resin ("EXA7311-G4", manufactured by DIC Corporation), and a cresol novolak type epoxy resin ("EPICLON N-680", manufactured by DIC Corporation).

Besides those exemplified above, an epoxy-modified polybutadiene can be used as the epoxy resin as the component (C). In particular, as for the component (C), from the viewpoint of handling properties during production of a printed wiring board, it is preferable to use an aromatic epoxy resin that is solid at room temperature and an epoxy resin that is liquid at room temperature in combination. From this viewpoint, an embodiment in which the epoxy resin exemplified as a preferable epoxy resin (the aromatic epoxy resin that is solid at room temperature) is used in combination with the epoxy-modified polybutadiene (the epoxy resin that is liquid at room temperature) is preferable. In this case, a content ratio of the both to be used in combination [(aromatic epoxy resin that is solid at room temperature)/(epoxy resin that is liquid at room temperature)] is preferably 95/5 to 60/40, more preferably 95/5 to 70/30, and still more preferably 95/5 to 80/20 in terms of a mass ratio.

The epoxy-modified polybutadiene is preferably one having a hydroxy group at a molecular terminal, more preferably one having a hydroxy group at both molecular terminals, still more preferably one having a hydroxy group only at a molecular terminal, and particularly preferably one having a hydroxy group only at both molecular terminals. In addition, there is no particular limitation as long as the number of hydroxy groups in the epoxy-modified polybutadiene is 1 or more, and the number of hydroxy groups is preferably 1 to 5, more preferably 1 or 2, and still more preferably 2.

From the viewpoint of adhesion strength to plated copper, heat resistance, thermal expansion coefficient, and softness, the epoxy-modified polybutadiene is preferably an epoxy-modified polybutadiene represented by the following general formula (C-1).

(C-1)

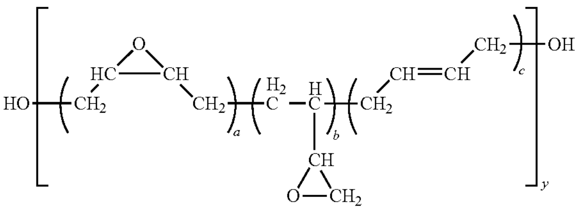

(In the formula (C-1), a, b, and c each represent a ratio of the structural unit within the parenthesis; a is 0.05 to 0.40, b is 0.02 to 0.30, and c is 0.30 to 0.80; and a, b, and c satisfy not only (a+b+c)=1.00 but also (a+c)>b. y represents the number of the structural unit within the parenthesis and is an integer of 10 to 250.)

In the general formula (C-1), a bonding order of the respective structural units within the parentheses is not in order. Namely, the structural unit expressed in the left, the structural unit expressed in the center, and the structural unit expressed in the right may pass each other, and when the structural units are expressed as (a), (b), and (c), respectively, the structural units may be in various bonding orders, such as -[(a)-(b)-(c)]-[(a)-(b)-(c)-]-, -[(a)-(c)-(b)]-[(a)-(c)-

(b)-]-, -[(b)-(a)-(c)]-[(b)-(a)-(c)-]-, -[(a)-(b)-(c)]-[(c)-(b)-(a)-]-, -[(a)-(b)-(a)]-[(c)-(b)-(c)-]-, and -[(c)-(b)-(c)]-[(b)-(a)-(a)-]-.

From the viewpoint of adhesion strength to plated copper, heat resistance, thermal expansion coefficient, and softness, a is preferably 0.10 to 0.30, b is preferably 0.10 to 0.30, and c is preferably 0.40 to 0.80. In addition, from the same viewpoint, y is preferably an integer of 30 to 180.

Examples of a commercially available product of the epoxidized polybutadiene in which a is 0.20, b is 0.20, c is 0.60, and y is an integer of 10 to 250 in the general formula (C-1) include "EPOLEAD (registered trademark) PB3600" (manufactured by Daicel Corporation).

(Content of Component (C))

In the case where the photosensitive resin composition according to the present embodiment contains the component (C), the content thereof is not particularly limited, and is preferably 5% to 70% by mass, more preferably 5% to 40% by mass, still more preferably 7% to 30% by mass, and particularly preferably 10% to 20% by mass on the basis of the total amount of the solid components in the photosensitive resin composition. When the content of the component (C) is 5% by mass or more, sufficient crosslinking of the photosensitive resin composition is obtained, and there is a tendency that the adhesion strength to plated copper and the electrical insulation reliability are improved. On the other hand, when the content is 70% by mass or less, there is a tendency that the resolution of via becomes good.

<(D) Elastomer>

The photosensitive resin composition according to the present embodiment may contain an elastomer as the component (D), and the photosensitive resin composition preferably contains the elastomer. When the photosensitive resin composition contains the component (D), there is a tendency that a photosensitive resin composition which is excellent in resolution of via, adhesion strength to plated copper, and electrical insulation reliability is provided. In addition, due to the component (D), there is also brought an effect for preventing a reduction in flexibility and adhesion strength to plated copper caused by a strain (internal stress) inside the cured product through curing shrinkage of the component (A).

The component (D) is preferably an elastomer that is liquid at 25° C.

The component (D) may be used alone or may be used in combination of two or more thereof.

Examples of the elastomer include a styrenic elastomer, an olefinic elastomer, a polyester-based elastomer, a urethane-based elastomer, a polyamide-based elastomer, an acrylic elastomer, and a silicone-based elastomer. It is preferable to use at least one selected from these elastomers as the elastomer. Such an elastomer contains a hard segment component and a soft segment component, so that there is a tendency that the former contributes to the heat resistance and the strength, and there is a tendency that the latter contributes to the softness and the toughness.

Among the elastomers described above, from the viewpoint of compatibility, solubility, and adhesion strength to plated copper, the component (D) contains preferably at least one selected from the group consisting of an olefinic elastomer, a polyester-based elastomer, and a urethane-based elastomer, and contains more preferably a polyester-based elastomer. In addition, the component (D) is preferably at least one selected from the group consisting of an olefinic elastomer, a polyester-based elastomer, and a urethane-based elastomer, and particularly preferably a polyester-based elastomer.

(Styrenic Elastomer)

Examples of the styrenic elastomer include a styrene-butadiene-styrene block copolymer, a styrene-isoprene-styrene block copolymer, a styrene-ethylene-butylene-styrene block copolymer, and a styrene-ethylene-propylene-styrene block copolymer. The styrenic elastomer may be used alone or may be used in combination of two or more thereof.

Examples of a component constituting the styrenic elastomer include styrene, and styrene derivatives such as α-methylstyrene, 3-methylstyrene, 4-propylstyrene, and 4-cyclohexylstyrene.

The styrenic elastomer is preferably one having a number average molecular weight of 1,000 to 50,000, and more preferably one having a number average molecular weight of 3,000 to 20,000.

In the present description, the number average molecular weight is a value obtained in terms of standard polystyrene by gel permeation chromatography (GPC) with tetrahydrofuran as a solvent.

A commercially available product of the styrenic elastomer can also be used.

(Olefinic Elastomer)

The olefinic elastomer is a polymer or copolymer of an α-olefin having 2 to 20 carbon atoms, such as ethylene, propylene, 1-butene, 1-hexene, and 4-methyl-pentene. The olefinic elastomer may be one having a hydroxy group at a molecular terminal and is preferably one having a hydroxy group at a molecular terminal. The olefinic elastomer may be used alone or may be used in combination of two or more thereof.

Suitable examples of the olefinic elastomer include a polyethylene, a polybutadiene, a hydroxy group-containing polybutadiene, a hydroxy group-containing polyisopropylene, an ethylene-propylene copolymer (EPR), and an ethylene-propylene-diene copolymer (EPDM). In addition, examples also include a copolymer of the α-olefin having 2 to 20 carbon atoms with a non-conjugated diene having 2 to 20 carbon atoms, such as dicyclopentadiene, 1,4-hexadiene, cyclooctadiene, methylene norbornene, ethylidene norbornene, butadiene, and isoprene. Further, examples also include a carboxy-modified NBR generated by copolymerizing a butadiene-acrylonitrile copolymer with methacrylic acid.

The olefinic elastomer is preferably one having a number average molecular weight of 1,000 to 8,000, and more preferably one having a number average molecular weight of 1,500 to 6,500.

A commercially available product of the olefinic elastomer can also be used.

(Polyester-Based Elastomer)

Examples of the polyester-based elastomer include ones obtained by polycondensing a dicarboxylic acid or a derivative thereof with a diol compound or a derivative thereof. The polyester-based elastomer may be used alone or may be used in combination of two or more thereof.

Examples of the dicarboxylic acid include: aromatic dicarboxylic acids, such as terephthalic acid, isophthalic acid, and naphthalene dicarboxylic acid; aromatic dicarboxylic acids generated by substituting a hydrogen atom of an aromatic ring in the aromatic dicarboxylic acid with a methyl group, an ethyl group, a phenyl group, or the like; aliphatic dicarboxylic acids having 2 to 20 carbon atoms, such as adipic acid, sebacic acid, and dodecane dicarboxylic acid; and alicyclic dicarboxylic acids, such as cyclohexane dicarboxylic acid. As for the dicarboxylic acid, from the viewpoint of adhesion to a base material, it is also preferable to use a dimer acid derived from a natural product. The dicarboxylic acid may be used alone or may be used in combination of two or more thereof.

Examples of the dicarboxylic acid derivative include anhydrides of the dicarboxylic acids.

Examples of the diol compound include: aliphatic diols, such as ethylene glycol, 1,3-propanediol, 1,4-butanediol, 1,6-hexanediol, and 1,10-decanediol; alicyclic diols, such as 1,4-cyclohexane diol; and aromatic diols represented by the following general formula (D-1). The diol compound may be used alone or may be used in combination of two or more thereof.

(D-1)

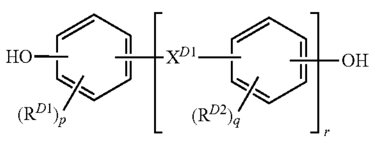

(In the general formula (D-1), $X^{D1}$ represents an alkylene group having 1 to 10 carbon atoms, an alkylidene group having 2 to 10 carbon atoms, a cycloalkylene group having 4 to 8 carbon atoms, —O—, —S—, or —$SO_2$—. $R^{D1}$ and $R^{D2}$ each independently represent a halogen atom or an alkyl group having 1 to 12 carbon atoms. p and q are each independently an integer of 0 to 4, and r is 0 or 1.)

In the general formula (D-1), examples of the alkylene group having 1 to 10 carbon atoms, which is represented by $X^{D1}$, include a methylene group, a 1,2-dimethylene group, a 1,3-trimethylene group, a 1,4-tetramethylene group, and a 1,5-pentamethylene group. From the viewpoint of resolution of via, adhesion strength to plated copper, and electrical insulation reliability, the alkylene group is preferably an alkylene group having 1 to 3 carbon atoms, and more preferably a methylene group.

Examples of the alkylidene group having 2 to 10 carbon atoms, which is represented by $X^{D1}$, include an ethylidene group, a propylidene group, an isopropylidene group, a butylidene group, an isobutylidene group, a pentylidene group, and an isopentylidene group. From the viewpoint of resolution of via, adhesion strength to plated copper, and electrical insulation reliability, the alkylidene group is preferably an isopropylidene group.

Examples of the cycloalkylene group having 4 to 8 carbon atoms, which is represented by $X^{D1}$, include a cyclopentylene group, a cyclohexylene group, and a cyclooctylene group.

Among the foregoing, $X^{D1}$ is preferably an alkylene group having 1 to 10 carbon atoms or an alkylidene group having 2 to 10 carbon atoms, and more preferably a methylene group or an isopropylidene group.

In the general formula (D-1), examples of the halogen atom which is represented by $R^{D1}$ and $R^{D2}$ include a fluorine atom, a chlorine atom, a bromine atom, and an iodine atom.

Examples of the alkyl group having 1 to 12 carbon atoms, which is represented by $R^{D1}$ and $R^{D2}$, include a methyl group, an ethyl group, a n-propyl group, an isopropyl group, a n-butyl group, an isobutyl group, a t-butyl group, and a n-pentyl group. The alkyl group is preferably an alkyl group having 1 to 6 carbon atoms, more preferably an alkyl group having 1 to 3 carbon atoms, and still more preferably a methyl group.

p and q are each independently an integer of 0 to 4, and preferably 0 or 1. r is 0 or 1, and may be any of these. When r is 0, the diol compound has a structure represented by the following general formula (D-1').

(D-1')

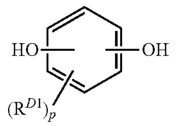

(In the general formula (D-1'), $X^{D1}$, $R^{D1}$, and p are the same as those in the general formula (D-1), and preferable embodiments thereof are also the same.)

Examples of the aromatic diol represented by the general formula (D-1) include bisphenol A, bis(4-hydroxyphenyl) methane, bis(4-hydroxy-3-methylphenyl)propane, and resorcin.

Further, as the polyester-based elastomer, a multi-block copolymer containing an aromatic polyester (for example, polybutylene terephthalate) moiety as a hard segment component and an aliphatic polyester (for example, polytetramethylene glycol) moiety as a soft segment component can also be used, and it is preferable to use the foregoing multi-block copolymer. As the multi-block copolymer, there are commercially available products of various grades depending upon differences in the type, the ratio, and the molecular weight of the hard segment and the soft segment. Specifically, examples thereof include "HYTREL (registered trademark)" (manufactured by DU PONT-TORAY CO., LTD.), "PELPRENE (registered trademark)" (manufactured by Toyobo Co., Ltd.), and "ESPEL (registered trademark)" and "TL (registered trademark)" (manufactured by Showa Denko Materials Co., Ltd.).

The polyester-based elastomer is preferably one having a number average molecular weight of 900 to 30,000, more preferably one having a number average molecular weight of 1,000 to 25,000, and still more preferably one having a number average molecular weight of 5,000 to 20,000.

(Urethane-Based Elastomer)

Suitable examples of the urethane-based elastomer include ones containing a hard segment composed of a short-chain diol and a diisocyanate and a soft segment composed of a high-molecular-weight (long-chain) diol and a diisocyanate. The urethane-based elastomer may be used alone or may be used in combination of two or more thereof.

Examples of the high-molecular-weight (long-chain) diol include polypropylene glycol, polytetramethylene oxide, poly(1,4-butylene adipate), poly(ethylene-1,4-butylene adipate), polycaprolactone, poly(1,6-hexylene carbonate), and poly(1,6-hexylene-neopentylene adipate). The number average molecular weight of the high-molecular-weight (long-chain) diol is preferably 500 to 10,000.

Examples of the short-chain diol include ethylene glycol, propylene glycol, 1,4-butanediol, and bisphenol A. The number average molecular weight of the short-chain diol is preferably 48 to 500.

The urethane-based elastomer is preferably one having a number average molecular weight of 1,000 to 25,000, more preferably one having a number average molecular weight of 1,500 to 20,000, and still more preferably one having a number average molecular weight of 2,000 to 15,000.

A commercially available product of the urethane-based elastomer can also be used.

(Polyamide-Based Elastomer)

The polyamide-based elastomer is roughly classified into two types, that is, a polyether block amide type in which a polyamide is used as the hard segment and a polyether is used as the soft segment, and a polyether ester block amide type in which a polyamide is used as the hard segment and a polyester is used as the soft segment.

Specific examples of the polyamide-based elastomer include block copolymers in which a polyamide is used as the hard segment component, and a polybutadiene, a butadiene-acrylonitrile copolymer, a styrene-butadiene copolymer, a polyisoprene, an ethylene-propylene copolymer, a polyether, a polyester, a polybutadiene, a polycarbonate, a polyacrylate, a polymethacrylate, a polyurethane, a silicone rubber, or the like is used as the soft segment component. The polyamide-based elastomer may be used alone or may be used in combination of two or more thereof.

The polyamide-based elastomer is preferably one having a number average molecular weight of 1,000 to 50,000, and more preferably one having a number average molecular weight of 2,000 to 30,000.

A commercially available product of the polyamide-based elastomer can also be used.

(Acrylic Elastomer)

Examples of the acrylic elastomer include polymers of a raw material monomer containing an acrylic acid ester as a main component. Suitable examples of the acrylic acid ester include ethyl acrylate, butyl acrylate, methoxyethyl acrylate, and ethoxyethyl acrylate. In addition, elastomers generated by copolymerizing, as a crosslinking point monomer, glycidyl methacrylate, allyl glycidyl ether or the like with an acrylic acid ester may be used, and elastomers generated by copolymerizing acrylonitrile, ethylene, or the like with an acrylic acid ester or with an acrylic acid ester and a crosslinking point monomer may be used. Specifically, examples thereof include an acrylonitrile-butyl acrylate copolymer, an acrylonitrile-butyl acrylate-ethyl acrylate copolymer, and an acrylonitrile-butyl acrylate-glycidyl methacrylate copolymer. The acrylic elastomer may be used alone or may be used in combination of two or more thereof.

The acrylic elastomer is preferably one having a number average molecular weight of 1,000 to 50,000, and more preferably one having a number average molecular weight of 2,000 to 30,000.

A commercially available product of the acrylic elastomer can also be used.

(Silicone-Based Elastomer)

The silicone-based elastomer is an elastomer containing an organopolysiloxane as a main component, and the silicone-based elastomer is classified into, for example, a polydimethylsiloxane-based elastomer, a polymethylphenylsiloxane-based elastomer, a polydiphenylsiloxane-based elastomer, and the like. The silicone-based elastomer may be used alone or may be used in combination of two or more thereof.

The silicone-based elastomer is preferably one having a number average molecular weight of 1,000 to 50,000, and more preferably one having a number average molecular weight of 2,000 to 30,000.

A commercially available product of the silicone-based elastomer can also be used.

(Other Elastomers)

The component (D) may also be an embodiment including at least one selected from the group consisting of a polyphenylene ether resin, a phenoxy resin, a polycarbonate resin, a polyamideimide resin, a polyimide resin, a xylene resin, a polyphenylene sulfide resin, a polyetherimide resin, a polyetheretherketone resin, a tetrafluoroethylene resin, a polyacrylonitrile resin, a maleic anhydride-modified polybutadiene, a phenol-modified polybutadiene, and a carboxy-modified polyacrylonitrile.

(Content of Component (D))

In the case where the photosensitive resin composition according to the present embodiment contains the component (D), the content thereof is preferably 0.5% to 20% by mass, more preferably 0.5% to 15% by mass, still more preferably 0.5% to 10% by mass, particularly preferably 1.0% to 6% by mass, and most preferably 1.0% to 4.0% by mass on the basis of the total amount of the solid components in the photosensitive resin composition. When the content of the component (D) is 0.5% by mass or more, there is a tendency that not only the effect for improving the adhesion strength to plated copper becomes sufficient, but also the electrical insulation reliability becomes much more excellent. When the content of the component (D) is 20% by mass or less, there is a tendency that all of the resolution of via, the adhesion strength to plated copper, and the electrical insulation reliability become sufficient.

<(E) Thermal Polymerization Initiator>

The photosensitive resin composition according to the present embodiment may contain a thermal polymerization initiator as the component (E).

The thermal polymerization initiator is not particularly limited, and examples thereof include: hydroperoxide compounds, such as diisopropylbenzene hydroperoxide "PERCUMYL P", cumene hydroperoxide "PERCUMYL H", and t-butyl hydroperoxide "PERBUTYL H" (all manufactured by NOF Corporation); dialkyl peroxide compounds, such as α,α-bis(t-butylperoxy-m-isopropyl)benzene "PERBUTYL P", dicumyl peroxide "PERCUMYL D", 2,5-dimethyl-2,5-bis(t-butyl peroxy)hexane "PERHEXA 25B", t-butyl cumyl peroxide "PERBUTYL C", di-t-butyl peroxide "PERBUTYL D", 2,5-dimethyl-2,5-bis(t-butylperoxy)hexyne-3 "PERHEXYNE 25B", and t-butyl peroxy-2-ethylhexanoate "PERBUTYL 0" (all manufactured by NOF Corporation); ketone peroxide compounds; peroxy ketal compounds, such as n-butyl 4,4-di-(t-butylperoxy)valerate ("PERHEXA V", manufactured by NOF Corporation); diacyl peroxide compounds; peroxy dicarbonate compounds; organic oxides, such as a peroxy ester compound; and azo compounds, such as 2,2'-azobisisobutyl nitrile, 2,2'-azobis(2-cyclopropylpropionitrile), and 2,2'-azobis(2,4-dimethylvaleronitrile). Among these, from the viewpoint that the photopolymerizability is not impeded and that the effect for improving the physical properties and characteristics of the photosensitive resin composition is remarkable, dialkyl peroxide compounds are preferable, and 2,5-dimethyl-2,5-bis(t-butylperoxy)hexyne-3 is more preferable.

The thermal polymerization initiator may be used alone or may be used in combination of two or more thereof.

(Content of Component (E))

In the case where the photosensitive resin composition according to the present embodiment contains the component (E), the content thereof is not particularly limited, and is preferably 0.01% to 5% by mass, more preferably 0.02% to 3% by mass, and still more preferably 0.03% to 2% by mass on the basis of the total amount of the resin components in the photosensitive resin composition. When the content of the component (E) is 0.01% by mass or more, there is a tendency that the thermal curing can be sufficiently performed, and when the content is 5% by mass or less, there is a tendency that the photosensitive characteristics and the heat resistance become good.

<(F) Inorganic Filler>

The photosensitive resin composition according to the present embodiment may contain an inorganic filler as the component (F), and the photosensitive resin composition preferably contains the inorganic filler. When the photosensitive resin composition contains the inorganic filler, the thermal-expansion reduction can be achieved, and warpage is less likely to occur. In the thermosetting resin composition which has hitherto been used as an interlayer insulting layer of a multilayer printed wiring board, it has been contemplated to achieve the thermal-expansion reduction by containing an inorganic filler. However, when the inorganic filler is contained in the photosensitive resin composition, the inorganic filler causes scattering of light to become an obstacle to the development, and thus, it is difficult to contemplate to achieve the thermal-expansion reduction by containing a large amount of the inorganic filler. In this way, with respect to the matter of containing the inorganic filler, there is a new problem in the photosensitive resin composition. However, according to the photosensitive resin composition of the present embodiment, even when the inorganic filler is contained, there is a tendency that the resolution of via can be maintained at a high level. Therefore, according to the photosensitive resin composition of the present embodiment, it is possible to make both the thermal-expansion reduction and the high resolution of via compatible with each other.

Examples of the component (F) include silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO·TiO_2$), barium carbonate ($BaCO_3$), magnesium carbonate ($MgCO_3$), aluminum hydroxide ($Al(OH)_3$), magnesium hydroxide ($Mg(OH)_2$), lead titanate ($PbOTiO_2$), lead zirconate titanate (PZT), lead lanthanum zirconate titanate (PLZT), gallium oxide ($Ga_2O_3$), spinel ($MgO·Al_2O_3$), mullite ($3Al_2O_3·2SiO_2$), cordierite ($2MgO·2Al_2O_3/5SiO_2$), talc ($3MgO·4SiO_2·H_2O$), aluminum titanate ($TiO_2·Al_2O_3$), yttria-containing zirconia ($Y_2O_3·ZrO_2$), barium silicate ($BaO·8SiO_2$), boron nitride (BN), calcium carbonate ($CaCO_3$), barium sulfate ($BaSO_4$), calcium sulfate ($CaSO_4$), zinc oxide (ZnO), magnesium titanate ($MgOTiO_2$), hydrotalcite, mica, fired kaolin, and carbon. The component (F) may be used alone or may be used in combination of two or more thereof.

From the viewpoint of heat resistance and thermal-expansion reduction, the component (F) preferably contains silica, and is more preferably silica. Further, from the viewpoint of improving the dispersibility of the inorganic filler in the photosensitive resin composition by an aggregation prevention effect, one surface-treated with alumina or an organic silane-based compound may be used as the component (F).

From the viewpoint of resolution of via, an average particle diameter of the component (F) is preferably 0.01 μm to 5 μm, more preferably 0.1 μm to 3 μm, still more preferably 0.1 μm to 2 μm, and particularly preferably 0.1 μm to 1 μm. Here, the average particle diameter of the component (F) is a volume average particle diameter of the inorganic filler in a dispersed state in the photosensitive resin composition and is a value obtained through the following measurement. First, the photosensitive resin composition is diluted (or dissolved) with methyl ethyl ketone 1,000 times, particles dispersed in the solvent are measured with a submicron particle analyzer (trade name: N5, manufactured by Beckman Coulter, Inc.) at a refractive index of 1.38 in accordance with International Standard ISO13321, and a particle diameter at an integrated value of 50% (volume basis) in the particle size distribution is defined as the average particle diameter (volume average particle diameter). In addition, with respect to the component (F) which is contained in the photosensitive resin film and the interlayer insulating layer provided on a carrier film, the average particle diameter can be measured by diluting (or dissolving) the component (F) with the solvent 1,000 times (volume ratio) and then performing the measurement with the submicron particle analyzer.

(Content of Component (F))

In the case where the photosensitive resin composition according to the present embodiment contains the component (F), the content thereof is not particularly limited, and is preferably 5% to 80% by mass, more preferably 15% to 60% by mass, still more preferably 15% to 50% by mass, particularly preferably 20% to 35% by mass, and most preferably 23% to 27.5% by mass on the basis of the total amount of the solid components in the photosensitive resin composition. When the content of the component (F) falls within the range, the mechanical strength, the heat resistance, the resolution of via, and the like can be improved.

<(G) Pigment>

The photosensitive resin composition according to the present embodiment may contain a pigment as the component (G) according to a desired color for the purpose of adjusting the photosensitivity, or the like. A colorant capable of developing the desired color may be appropriately selected and used as the component (G), and for example, there are preferably exemplified known colorants, such as phthalocyanine blue, phthalocyanine green, iodine green, diazo yellow, crystal violet, carbon black, and naphthalene black.

(Content of Component (G))

In the case where the photosensitive resin composition according to the present embodiment contains the component (G), the content thereof is preferably 0.01% to 5% by mass, more preferably 0.03% to 3% by mass, and still more preferably 0.05% to 2% by mass on the basis of the total amount of the solid components in the photosensitive resin composition, from the viewpoint of adjusting the photosensitivity, or the like.

<(H) Curing Agent or Curing Accelerator>

In the photosensitive resin composition according to the present embodiment, a curing agent or a curing accelerator may be contained from the viewpoint of further improving various properties, such as heat resistance, adhesion strength to plated copper, and chemical resistance. In particular, in the case where the thermosetting resin (C) contains an epoxy resin, it is preferable to contain an epoxy resin curing agent as the curing agent.

Examples of the component (H) include: active ester-based curing agents; imidazole derivatives, such as 2-methylimidazole, 2-ethyl-4-methylimidazole, 1-benzyl-2-methylimidazole, 2-phenylimidazole, and 2-phenyl-4-methyl-5-hydroxymethylimidazole; guanamine compounds, such as acetoguanamine and benzoguanamine; polyamine compounds, such as diaminodiphenylmethane, m-phenylenediamine, m-xylenediamine, diaminodiphenylsulfone, dicyandiamide, urea, a urea derivative, melamine, and a polybasic hydrazide; organic acid salts or epoxy adducts of the imidazole derivatives, the guanamine compounds, and the polyamine compounds; organic acid salts and epoxy adducts of the imidazole derivatives, the guanamine compounds, and the polyamine compounds; amine complexes of boron trifluoride; triazine derivatives, such as ethyldiamino-s-triazine, 2,4-diamino-s-triazine, and 2,4-diamino-6-xylyl-s-triazine; tertiary amine compounds, such as trimethylamine, N,N-dimethyloctylamine, N-benzyldimethylamine, pyridine, N-methylmorpholine, hexa(N-methyl)melamine, 2,4,6-tris (dimethylaminophenol), tetramethylguanidine, and m-aminophenol; polyphenol compounds, such as polyvinyl phenol, polyvinyl phenol bromide, phenol novolak, and an alkylphenol novolak; organic phosphine compounds, such as tributyl phosphine, triphenyl phosphine, and tris-2-cyanoethyl phosphine; phosphonium salts, such as tri-n-butyl (2,5-dihydroxyphenyl)phosphonium bromide and hexadecyl tributyl phosphonium chloride; quaternary ammonium salts, such as benzyl trimethylammonium chloride and phenyl tributylammonium chloride; the polybasic acid anhydrides described above; and diphenyliodonium tetrafluoroborate, triphenylsulfonium hexafluoroantimonate, and 2,4,6-triphenylthiopyrylium hexafluorophosphate.

Among these, polyamine compounds are preferable, and melamine is more preferable from the viewpoint of further improving various properties, such as heat resistance, adhesion strength to plated copper, and chemical resistance.

In the case where the photosensitive resin composition according to the present embodiment contains the component (H), the content thereof is preferably 0.01% to 20% by mass, more preferably 0.02% to 10% by mass, and still more preferably 0.03% to 3% by mass on the basis of the total amount of the resin components in the photosensitive resin composition.

<Diluent>

If necessary, a diluent may be used in the photosensitive resin composition according to the present embodiment. As the diluent, for example, an organic solvent can be used. Examples of the organic solvent include: ketones, such as methyl ethyl ketone and cyclohexanone; aromatic hydrocarbons, such as toluene, xylene, and tetramethylbenzene; glycol ethers, such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters, such as ethyl acetate, butyl acetate, propylene glycol monoethyl ether acetate, butyl cellosolve acetate, and carbitol acetate; aliphatic hydrocarbons, such as octane and decane; and petroleum-based solvents, such as petroleum ether, petroleum naphtha, hydrogenated petroleum naphtha, and solvent naphtha. The diluent may be used alone or may be used in combination of two or more thereof. The diluent is preferably a ketone or an ester, and more preferably an ester.

(Content of Diluent)

The content of the diluent may be appropriately adjusted such that the concentration of the total amount of the solid components in the photosensitive resin composition is preferably 40% to 90% by mass, more preferably 50% to 80% by mass, and still more preferably 55% to 70% by mass. By adjusting the use amount of the diluent in this way, the coatability of the photosensitive resin composition is improved, thereby making it possible to form a higher-resolution pattern.

<Other Additives>

If necessary, the photosensitive resin composition according to the present embodiment can contain various known common additives, for example, a polymerization inhibitor such as hydroquinone, methyl hydroquinone, hydroquinone monomethyl ether, catechol, and pyrogallol; a tackifier such as bentone and montmorillonite; a foam stabilizer such as a silicone-based foam stabilizer, a fluorine-based foam stabilizer, and a vinyl resin-based foam stabilizer; and a silane coupling agent. Further, the photosensitive resin composition may also contain a flame retardant such as a brominated epoxy compound, an acid-modified brominated epoxy compound, an antimony compound, a phosphate compound of a phosphorus-based compound, an aromatic condensed phosphate ester, and a halogen-containing condensed phosphate ester, and a thermoplastic resin such as a polyester polyurethane resin.

The photosensitive resin composition according to the present embodiment can be obtained by kneading and mixing the respective components in a roll mill, a bead mill, or the like.

Here, the photosensitive resin composition according to the present embodiment may be used in a liquid state or may be used in a film state.

In the case of using the photosensitive resin composition in a liquid state, a coating method of the photosensitive resin composition according to the present embodiment is not particularly limited, and examples thereof include various coating methods, such as a printing method, a spin coating method, a spray coating method, a jet dispense method, an ink jet method, and an immersion coating method. Among these, the coating method may be appropriately selected from a printing method and a spin coating method from the viewpoint of more easily forming a photosensitive layer.

In the case of using the photosensitive resin composition in a film state, for example, the photosensitive resin composition can be used in the form of a photosensitive resin film to be described later. In this case, the photosensitive layer can be formed in a desired thickness by being laminated on a carrier film using a laminator or the like. The case of using the photosensitive resin composition in a film state is preferable because production efficiency of a multilayer printed wiring board is high.

[Photosensitive Resin Film and Photosensitive Resin Film for Interlayer Insulating Layer]

The photosensitive resin film according to the present embodiment is a photosensitive layer to be an interlayer insulating layer later and is formed of the photosensitive resin composition according to the present embodiment. The photosensitive resin film according to the present embodiment may also be an embodiment in which the photosensitive resin film is provided on a carrier film.

A thickness (thickness after drying) of the photosensitive resin film (photosensitive layer) is not particularly limited, and is preferably 1 μm to 100 μm, more preferably 1 μm to 50 μm, and still more preferably 5 μm to 40 μm from the viewpoint of thinning of the multilayer printed wiring board.

The photosensitive resin film according to the present embodiment is obtained by, for example, coating the carrier film with the photosensitive resin composition according to the present embodiment using a known coating apparatus, such as a comma coater, a bar coater, a kiss coater, a roll coater, a gravure coater, and a die coater, followed by drying to form the photosensitive layer to be an interlayer insulating layer later.

Examples of the carrier film include polyester films such as a polyethylene terephthalate film and a polybutylene terephthalate film, and polyolefin films such as a polypropylene film and a polyethylene film. A thickness of the carrier film may be appropriately selected from the range of 5 μm to 100 μm, and is preferably 5 μm to 60 μm, and more preferably 15 μm to 45 μm.

The photosensitive resin film according to the present embodiment can also be provided with a protective film on a surface of the photosensitive layer, which is located at the opposite side to a surface thereof coming into contact with the carrier film. As the protective film, a polymer film made of a polyethylene or a polypropylene, or the like can be used. In addition, a polymer film the same as or different from the carrier film may be used.

A coating film to be formed by applying the photosensitive resin composition can be dried with hot air or using a drier with far-infrared rays or near-infrared rays. A drying temperature is preferably 60° C. to 150° C., more preferably 70° C. to 120° C., and still more preferably 80° C. to 100° C. In addition, a drying time is preferably 1 to 60 minutes, more preferably 2 to 30 minutes, and still more preferably 5 to 20 minutes. The content of the remaining diluent in the photosensitive resin film after drying is preferably 3% by mass or less, more preferably 2% by mass or less, and still more preferably 1% by mass or less from the viewpoint of avoiding the diluent from diffusion in a process for producing a multilayer printed wiring board.

The photosensitive resin film according to the present embodiment is excellent in resolution of via, adhesion strength to plated copper, electrical insulation reliability, and crack resistance, and is thus suited as the interlayer insulating layer of the multilayer printed wiring board. Namely, the present disclosure also provides a photosensitive resin film for interlayer insulating layer. The photosensitive resin film for interlayer insulating layer can also be referred to as an interlayer insulating photosensitive film.

[Multilayer Printed Wiring Board and Method for Producing Multilayer Printed Wiring Board]

The present disclosure also provides a multilayer printed wiring board including an interlayer insulating layer to be formed using the photosensitive resin composition or the photosensitive resin film according to the present embodiment. The multilayer printed wiring board according to the present embodiment is not particularly limited with respect to the method for producing the same as long as the method includes a step of forming an interlayer insulating layer using the photosensitive resin composition according to the present embodiment, and for example, the multilayer printed wiring board can be easily produced by the following method for producing the multilayer printed wiring board according to the present embodiment.

As an example of a preferable embodiment of the method for producing the multilayer printed wiring board, a method for producing a multilayer printed wiring board using the photosensitive resin film (photosensitive resin film for interlayer insulating layer) according to the present embodiment will be described while appropriately referring to FIG. 1.

A multilayer printed wiring board 100A can be produced by, for example, a production method including the following (1) to (4):

(1): laminating the photosensitive resin film according to the present embodiment on one surface or both surfaces of a circuit substrate (hereinafter referred to as a "lamination process (1)");

(2): exposing and developing the photosensitive resin film laminated in the (1), to form an interlayer insulating layer having a via (hereinafter referred to as a "photo via formation process (2)");

(3): subjecting the via and the interlayer insulating layer to a roughening treatment (hereinafter referred to as a "roughening treatment process (3)"); and (4): forming a circuit pattern on the interlayer insulating layer (hereinafter referred to as a "circuit pattern formation process (4)").

(Lamination Process (1))

In the lamination process (1), the photosensitive resin film (photosensitive resin film for interlayer insulating layer) according to the present embodiment is laminated on one surface or both surfaces of a circuit substrate (substrate 101 having a circuit pattern 102) by using a vacuum laminator. Examples of the vacuum laminator include a vacuum applicator manufactured by Nichigo-Morton Co., Ltd., a vacuum pressure type laminator manufactured by Meiki Co., Ltd., a roll type dry coater manufactured by Hitachi, Ltd., and a vacuum laminator manufactured by Showa Denko Materials Electronics Co., Ltd.

In the case where a protective film is provided on the photosensitive resin film, after stripping or removing the protective film, the photosensitive resin film can be laminated by pressure bonding to the circuit substrate while pressurizing and heating in a state in which the photosensitive resin film is in contact with the circuit substrate.

The lamination can be carried out at, for example, a pressure-bonding temperature of 70° C. to 130° C. and a pressure-bonding pressure of 0.1 MPa to 1.0 MPa under a reduced pressure of an air pressure of 20 mmHg (26.7 hPa) or less after preliminarily heating the photosensitive resin film and the circuit substrate if necessary. However, the lamination is not particularly limited to this condition. In addition, a method for the lamination may be in a batch mode or may be in a continuous mode with rolls.

Finally, the photosensitive resin film laminated on the circuit substrate (hereinafter occasionally referred to as a "photosensitive layer") is cooled to a temperature close to room temperature, to form an interlayer insulating layer 103. The carrier film may be stripped off here or may be stripped off after exposure as described later.

(Photo Via Formation Process (2))

In the photo via formation process (2), at least a part of the photosensitive resin film laminated on the circuit substrate is exposed, followed by performing the development. A portion irradiated with actinic rays is photo-cured through the exposure, whereby a pattern is formed. A method for the exposure is not particularly limited, and for example, a method of placing a negative or positive mask pattern that is called an artwork between an exposure apparatus and the photosensitive resin film, then irradiating the photosensitive resin film with imagewise actinic rays via the exposure apparatus (mask exposure method) may be adopted. Alternatively, a method of irradiating the photosensitive resin film with imagewise actinic rays by a direct writing exposure method, such as a laser direct imaging (LDI) exposure method and a digital light processing (DLP) exposure method, may be adopted.

As a light source of the actinic rays, a known light source can be used. Specifically, examples of the light source include: gas lasers, such as a carbon arc lamp, a mercury vapor arc lamp, a high-pressure mercury lamp, a xenon lamp, and an argon laser; solid lasers, such as a YAG laser; and ones of effectively radiating ultraviolet rays or visible light rays, such as a semiconductor laser. An exposure amount is appropriately selected depending upon a light source to be used, the thickness of the photosensitive layer, and the like, and for example, in the case of irradiation with ultraviolet rays from a high-pressure mercury lamp, when the thickness of the photosensitive layer is 1 μm to 100 μm, the exposure amount is typically preferably about 10 $mJ/cm^2$ to 1,000 $mJ/cm^2$, and more preferably 15 $mJ/cm^2$ to 500 $mJ/cm^2$.

In the development, when an uncured portion of the photosensitive layer is removed from the substrate, an interlayer insulating layer formed of a photo-cured cured product is formed on the substrate.

In the case where the carrier film exists on the photosensitive layer, after removing the carrier film, the removal (development) of an unexposed portion is performed. Examples of a development method include wet development and dry development, all of which may be adopted. The wet development is widely adopted, and the wet development can also be adopted in the present embodiment.

In the case of wet development, the development is performed by a known development method with a developer corresponding to the photosensitive resin composition. Examples of the development method include a dip method, a paddle method, a spray method, blushing, slapping, scrapping, and swinging immersion. Among these, from the viewpoint of improving resolution of via, a spray method is preferable, and a high-pressure spray method is more preferable as the spray method. The development may be carried out by a single method or may be carried out by a combination of two or more methods.

The constitution of the developer is appropriately selected according to the constitution of the photosensitive resin composition. Examples of the developer include an alkaline aqueous solution, an aqueous developer, and an organic solvent-based developer. Among these, an alkaline aqueous solution is preferable as the developer.

In the photo via formation process (2), after performing the exposure and the development, by performing post UV curing with an exposure amount of about 0.2 J/$cm^2$ to 10 J/$cm^2$ (preferably 0.5 J/$cm^2$ to 5 J/$cm^2$) and post thermal curing at a temperature of about 60° C. to 250° C. (preferably 120° C. to 200° C.) if necessary, the interlayer insulating layer may be further cured, which is preferable.

With the above-described method, an interlayer insulating layer having a via 104 is formed. The shape of the via is not particularly limited. When the shape is explained in terms of a cross-sectional shape, examples thereof include a quadrilateral and a reverse trapezoid (a top side is longer than a bottom side). When the shape of the via is explained in terms of a shape seen from the front (direction at which a via bottom is seen), examples thereof include a circle and a quadrilateral. In via formation by photolithography in the present embodiment, a via having a cross-sectional shape of a reverse trapezoid (a top side is longer than a bottom side) can be formed, and in this case, a throwing power on a via wall surface of plated copper becomes high, which is thus preferable.

A size (diameter) of the via formed by the present process can be controlled to 60 μm or less, and it is also possible to control the size to less than 40 μm or 30 μm or less. It is possible to make the size smaller than that of a via prepared by laser processing. A lower limit value of the size (diameter) of the via formed by the present process is not particularly limited, and the size may be 15 μm or more or may be 20 μm or more.

However, the size (diameter) of the via formed by the present process is not always limited to 60 μm or less, the size may be, for example, about 200 μm or less, and for example, the size may be optionally selected within the range of 15 μm to 300 μm.

(Roughening Treatment Process (3))

In the roughening treatment process (3), the via and the surface of the interlayer insulating layer are subjected to a roughening treatment with a roughening liquid. In the case where a smear is generated in the photo via formation process (2), the smear may be removed with the roughening liquid. The roughening treatment can be performed simultaneously with the removal of the smear.

Examples of the roughening liquid include a chromium/sulfuric acid roughening liquid, an alkaline permanganate roughening liquid (for example, a sodium permanganate roughening liquid), and a sodium fluoride/chromium/sulfuric acid roughening liquid.

An uneven anchor is formed on the via and the surface of the interlayer insulating layer through the roughening treatment.

(Circuit Pattern Formation Process (4))

The circuit pattern formation process (4) is a process of, after the roughening treatment process (3), forming a circuit pattern on the interlayer insulating layer.

From the viewpoint of forming fine wirings, it is preferable to carry out the formation of a circuit pattern through a semi-additive process. According to the semi-additive process, conduction of the via is performed along with the formation of the circuit pattern.

In the semi-additive process, first, the via bottom, the via wall surface, and the entire surface of the interlayer insulating layer after the roughening treatment process (3) are subjected to an electroless copper plating treatment using a palladium catalyst or the like, to form a seed layer 105. The seed layer is one for forming a power supply layer for the purpose of performing electrolytic copper plating, and is preferably formed in a thickness of about 0.1 μm to 2.0 μm. When the thickness of the seed layer is 0.1 μm or more, there is a tendency that a reduction in connection reliability during electrolytic copper plating can be prevented, and when the thickness is 2.0 μm or less, it is not needed to increase an etching amount during flash etching of the seed layer between the wirings, and there is a tendency that damage to the wirings during etching is prevented.

The electroless copper plating treatment is performed when metallic copper is deposited on the via and the surface of the interlayer insulating layer due to the reaction between copper ions and a reducing agent.

The electroless plating treatment method and the electrolytic plating treatment method may be performed by known methods and are not particularly limited. The catalyst in the electroless plating treatment process is preferably a palladium-tin mixture catalyst, and a primary particle diameter of the catalyst is preferably 10 nm or less. In addition, as for a plating composition of the electroless plating treatment process, it is preferable that hypophosphorous acid is contained. The hypophosphorous acid functions as a reducing agent.

As an electroless copper plating solution, a commercially available product can be used, and examples of the commercially available product include "MSK-DK" manufactured by Atotech Japan K.K., and "THRU-CUP (registered trademark) PEA ver. 4" Series manufactured by C. Uyemura & Co., Ltd.

After performing the electroless copper plating treatment, a dry film resist is subjected to thermocompression bonding on the electroless plated copper by using a roll laminator. The thickness of the dry film resist must be made higher than the height of the wirings after copper electroplating, and from this viewpoint, a dry film resist having a thickness of 5 μm to 30 μm is preferable. As for the dry film resist, for example, "PHOTEC" Series manufactured by Showa Denko Materials Co., Ltd. is used.

After the thermocompression bonding of the dry film resist, for example, the dry film resist is exposed through a mask having a desired wiring pattern drawn therein. The exposure can be performed by using the same apparatus and light source as those which may be used during the formation of the via on the photosensitive resin film. After the exposure, the carrier film on the dry film resist is stripped off, the development is performed with an alkaline aqueous solution, and an unexposed portion is removed to form a resist pattern 106. Thereafter, if necessary, a work of removing a development residue of the dry film resist using a plasma or the like may be performed.

After the development, copper electroplating is performed, thereby achieving the formation and via-filling of a circuit layer 107 of copper.

After the copper electroplating, the dry film resist is stripped off by using an alkaline aqueous solution or an amine-based stripping agent. After stripping off the dry film resist, removal (flash etching) of the seed layer between the wirings is performed. The flash etching is performed by using an acidic solution such as sulfuric acid and hydrogen peroxide and an oxidizing solution. Specifically, examples thereof include "SAC" manufactured by JCU Corporation, and "CPE-800" manufactured by Mitsubishi Gas Chemical Company, Inc. After the flash etching, if necessary, removal of palladium or the like attached to a portion between the wirings is performed. The removal of palladium can be preferably performed using an acidic solution such as nitric acid and hydrochloric acid.

After stripping off of the dry film resist or the flash etching treatment, a post-baking treatment is preferably performed. In the post-baking treatment, an unreacted thermosetting component is thoroughly thermally cured, whereby the electrical insulation reliability, the curing characteristics, and the adhesion strength to plated copper are improved. Thermosetting conditions vary depending on the kind of the resin composition, and the like, and it is preferable that a curing temperature is 150° C. to 240° C., and a curing time is 15 to 100 minutes. According to the post-baking treatment, the process for producing the printed wiring board by the general photo via method is accomplished, and the substrate is produced by repeating the present process according to the number of required interlayer insulating layers. Then, a solder resist layer 108 is preferably formed on the outermost layer.

In the light of the above, the method for producing a multilayer printed wiring board in which a via is formed using the photosensitive resin composition according to the present embodiment has been described, and since the photosensitive resin composition according to the present embodiment is excellent in pattern resolution, for example, the photosensitive resin composition is also suitable for forming a cavity for the purpose of internally containing a chip, a passive device or the like. For example, the cavity can be suitably formed in a manner in which a drawing pattern during exposure of the photosensitive resin film to form a pattern is formed into one capable of forming a desired cavity according to the description regarding the multilayer printed wiring board.

Further, the photosensitive resin composition according to the present embodiment is also useful as a surface protective film such as a solder resist or the like.

[Semiconductor Package]

The present disclosure also provides a semiconductor package including the multilayer printed wiring board according to the present embodiment and a semiconductor device. The semiconductor package according to the present embodiment can be produced by mounting a semiconductor device, such as a semiconductor chip and a memory, at a predetermined position in the multilayer printed wiring board according to the present embodiment and sealing the semiconductor device with a sealing resin or the like.

EXAMPLES

The present embodiment is hereinafter described in more detail by reference to Examples, but the present embodiment is not limited to these Examples.

Photosensitive resin compositions obtained in Examples were evaluated with respect to characteristics by the following methods.

[1. Evaluation of Resolution of Via]

(1-1) Preparation of Laminate for Evaluation

A surface of a 12 μm thick copper foil of a substrate for printed wiring board in which the copper foil was laminated on a glass epoxy base material (trade name: "MCL-E-679", manufactured by Showa Denko Materials Co., Ltd.) was treated with a roughening treatment liquid (trade name: "CZ-8100", manufactured by MEC CO., Ltd.) and then washed with water, followed by drying to obtain a substrate for printed wiring board that was subjected to the roughening treatment.

Subsequently, a protective film was stripped off and removed from a "photosensitive resin film having the carrier film and the protective film stuck thereon" as produced in each of Examples and Comparative Examples, and the exposed photosensitive resin film was placed in a state of being in contact with the copper foil of the substrate for printed wiring board that was subjected to the roughening treatment, followed by performing a lamination treatment with a press type vacuum laminator (trade name: "MVLP-500", manufactured by Meiki Co., Ltd.). Conditions of the lamination were set such that a press hot plate temperature was 70° C., an evacuation time was 20 seconds, a lamination press time was 30 seconds, an atmospheric pressure was 4 kPa or less, and a pressure-bonding pressure was 0.4 MPa. After the lamination treatment, the photosensitive resin film was allowed to stand at room temperature for 1 hour or longer, and a laminate for evaluation in which the photosensitive resin film and the carrier film were laminated in this order on the copper foil surface of the substrate for printed wiring board was obtained.

(1-2) Sensitivity Measurement of Photosensitive Resin Film

A 41-stage step tablet was disposed after the carrier film of the laminate for evaluation obtained in the above (1-1) was stripped off and removed, and the exposure was performed by a direct imaging exposure apparatus "DXP-3512" (manufactured by ORC MANUFACTURING CO., LTD.) equipped with an ultra-high pressure mercury lamp as a light source. Regarding an exposure pattern, a pattern in which squares were arranged in a lattice form ((length of one side):(distance between centers of squares)=1:2) was used.

After the exposure, the resultant was allowed to stand at room temperature for 30 minutes, and the photosensitive resin composition in an unexposed area was spray-developed with a 1% by mass sodium carbonate aqueous solution at 30° C. for 60 seconds. After the development, an amount of exposure energy with which the number of gloss remaining steps of the 41-stage step tablet became 8.0 was set as a sensitivity (unit: $mJ/cm^2$) of the photosensitive resin film. By using a pattern exposed at this sensitivity, the resolution of via provided in the photosensitive resin film was evaluated according to the following evaluation criteria.

(1-3) Evaluation of Resolution of Via

Regarding the evaluation of the resolution of via, exposure was performed at the sensitivity of the photosensitive resin film measured in the above (1-2), namely the amount of exposure energy with which the number of steps became 8.0; subsequently, spray-development was performed; then, a via pattern was observed with an optical microscope; and the evaluation was performed according to the following criteria. A state expressed by the term "opened" above refers to a state in which during observation of a via portion of a dot pattern with an optical microscope, the copper foil of the base material for printed wiring board can be confirmed. A determination with "A" indicates good characteristics.

A: A via portion with a φ60 μm dot pattern is opened.

B: The via portion with a φ60 μm dot pattern is not opened.

C: Not photo-cured.

[2. Evaluation of Adhesion Strength (Peel Strength) to Plated Copper]

While stripping off the protective film from the "photosensitive resin film having the carrier film and the protective film stuck thereon" as produced in each of Examples and Comparative Examples, the lamination was performed on a copper-cladded laminate substrate having a thickness of 1.0 mm with a press type vacuum laminator (trade name: "MVLP-500", manufactured by Meiki Co., Ltd.) under conditions in which a pressure-bonding pressure was 0.4 MPa, a press hot plate temperature was 80° C., an evacuation time was 25 seconds, a lamination press time was 25 seconds, and an atmospheric pressure was 4 kPa or less, to obtain a laminate.

The obtained laminate was subjected to whole surface exposure at 500 $mJ/cm^2$ using a parallel light exposure apparatus (trade name: "EXM-1201", manufactured by ORC MANUFACTURING CO., LTD.) equipped with an ultra-high pressure mercury lamp as a light source. Subsequently, the laminate was exposed with an ultraviolet ray exposure apparatus at an exposure amount of 2,000 $mJ/cm^2$ and then heated at 170° C. for 1 hour, to obtain a laminate for evaluation in which a cured product (cured film) was formed on the copper-cladded laminate substrate.

Subsequently, an aqueous solution containing 200 mL/L of diethylene glycol monobutyl ether and 5 g/L of sodium hydroxide was first prepared as a swelling liquid, and the laminate for evaluation was immersed in the swelling liquid heated to 70° C. for 10 minutes. Subsequently, an aqueous solution containing 60 g/L of potassium permanganate and 40 g/L of sodium hydroxide was prepared as a roughening liquid, and the laminate for evaluation was immersed in the roughening liquid heated to 70° C. for 15 minutes. Continuously, a neutralizing liquid (aqueous solution containing 30 g/L of tin chloride ($SnCl_2$) and 300 ml/L of hydrogen chloride) was prepared, and the laminate for evaluation was immersed in the neutralizing liquid heated to 40° C. for 5 minutes, thereby reducing potassium permanganate. In this way, a surface of the cured product of the laminate for evaluation was subjected to a desmear treatment.

Subsequently, the desmeared surface of the cured product of the laminate for evaluation was treated with a 60° C. alkaline cleaner (trade name: "Cleaner Securigant 902", manufactured by Atotech Japan K.K.) for 5 minutes, and then was degreased and washed. After washing, the desmeared cured product was treated with a 23° C. pre-dip liquid (trade name: "Pre-dip Neogant B", manufactured by Atotech Japan K.K.) for 1 minute. Thereafter, the cured product was treated with a 35° C. activator liquid (trade name: "Activator Neogant 834", manufactured by Atotech Japan K.K.) for 5 minutes, and then, the cured product was treated with a 30° C. reducing liquid (trade name: "Reducer Neogant WA", manufactured by Atotech Japan K.K.) for 5 minutes.

The thus-obtained laminate for evaluation was placed in a chemically copper enriched liquid ("Basic Printgant MSK-DK", "Copper Printgant MSK", and "Stabilizer Printgant MSK", trade name, all manufactured by Atotech Japan K.K.), and electroless plating was performed until the thickness of the plating was about 0.5 μm. After the electroless plating, an annealing treatment was performed for 30 minutes at a temperature of 120° C. in order to remove a residual hydrogen gas. Thereafter, electrolytic plating with copper sulfate was performed, and an annealing treatment was performed at 180° C. for 60 minutes, thereby forming a conductor layer having a thickness of 25 μm.

With respect to the laminate for evaluation having a conductor layer formed by the above method, vertical stripping strength at 23° C. was measured in accordance with JIS C6481 (1996) and was evaluated according to the following evaluation criteria.

A: The adhesion strength to plated copper was 0.40 kN/m or more.

B: The adhesion strength to plated copper was 0.30 kN/m or more and less than 0.40 kN/m.

C: The adhesion strength to plated copper was less than 0.30 kN/m.

[3. Measurement of Surface Roughness (Arithmetic Average Roughness; Ra)]

A substrate was prepared in the same manner as the substrate for peel strength measurement in the [2. Evaluation of Adhesion Strength (Peel Strength) to Plated Copper], and was subjected to the treatments up to the desmear treatment by the same methods to prepare an evaluation substrate for surface roughness measurement.

The surface roughness (arithmetic average roughness; Ra) of an insulating layer was measured using a non-contact type surface roughness meter ("Contour GT-K", manufactured by Bruker Corporation) with an external lens at a magnification of 50 times and an internal lens at a magnification of 1 time. An average value of five points was defined as Ra, and then the surface roughness was evaluated according to the following evaluation criteria.

A: The Ra was less than 150 nm.

B: The Ra was 150 nm or more and less than 300 nm.

C: The Ra was 300 nm or more.

[4. Evaluation of HAST Resistance (Electrical Insulation Reliability after Moisture Absorption)]

A laminate having a conductor layer formed therein was obtained in the same operations as in the [2. Evaluation of Adhesion Strength (Peel Strength) to Plated Copper], except that a conductor layer having a thickness of 35 μm was formed in place of formation of the conductor layer having a thickness of 25 μm.

The formed conductor layer was etched such that a circular electrode having a diameter (φ) 6 mm was formed. Continuously, on the electrode and the cured film, a photosensitive solder resist film "FZ-2700GA" (trade mane, manufactured by Showa Denko Materials Co., Ltd.) was laminated using a press type vacuum laminator (trade name: "MVLP-500", manufactured by Meiki Co., Ltd.) under conditions in which a pressure-bonding pressure was 0.4 MPa, a press hot plate temperature was 80° C., an evacuation time was 25 seconds, a lamination press time was 40 seconds, and an atmospheric pressure was 4 kPa or less, to obtain a laminate for evaluation. A thickness of the photosensitive solder resist film layer in the laminate for evaluation was 25 μm.

The laminate for evaluation obtained by the above method was subjected to whole surface exposure at 500 $mJ/cm^2$ using a parallel light exposure apparatus (trade name: "EXM-1201", manufactured by ORC MANUFACTURING CO., LTD.) equipped with an ultra-high pressure mercury lamp as a light source. Subsequently, the laminate was exposed with an ultraviolet ray exposure apparatus at an exposure amount of 2,000 $mJ/cm^2$ and then heated at 160° C. for 1 hour, to obtain a cured film.

Continuously, wiring was performed such that the circular electrode was a plus pole, and the copper foil at the side of the copper-cladded laminate substrate at which the circular electrode was formed was a minus pole, and the resultant was exposed with a pressure cooker (model name: "unsaturated-type highly accelerated life testing machine: PC-422RP", manufactured by HIRAYAMA Manufacturing Corporation) under a condition of 135° C., 85%, and 5.5 V for 200 hours. A resistance value between the electrodes was measured, and the evaluation was performed according to the following evaluation criteria.

A: The resistance value at the time of elapsing 200 hours was $10\times10^7\Omega$ or more.

B: The resistance value at the time of elapsing 200 hours was $10\times10^6\Omega$ or more and less than $10\times10^7\Omega$.

C: The resistance value at the time of elapsing 200 hours was less than $10\times10^6\Omega$.

[5. Evaluation of Crack Resistance]

(5-1) Preparation of Laminate for Evaluation

A surface of a 12 μm thick copper foil of a substrate for printed wiring board in which the copper foil was laminated on a glass epoxy base material (trade name: "MCL-E-679", manufactured by Showa Denko Materials Co., Ltd.) was polished with an abrasive brush, and then washed with water, followed by drying to obtain a substrate for printed wiring board that was subjected to the roughening treatment. Subsequently, a protective film was stripped off and removed from the "photosensitive resin film having the carrier film and the protective film stuck thereon" as produced in each of Examples and Comparative Examples. The exposed photosensitive resin film was placed in a state of being in contact with the copper foil of the substrate for printed wiring board that was subjected to the roughening treatment, followed by performing a lamination treatment with a press type vacuum laminator (trade name: "MVLP-500", manufactured by Meiki Co., Ltd.). Conditions of the lamination were set such that a press hot plate temperature was 70° C., an evacuation time was 20 seconds, a lamination press time was 30 seconds, an atmospheric pressure was 4 kPa or less, and a pressure-bonding pressure was 0.4 MPa. After the lamination treatment, the photosensitive resin film was allowed to stand at room temperature for 1 hour or longer, and a laminate for evaluation in which the photosensitive resin film and the carrier film were laminated in this order on the copper foil surface of the substrate for printed wiring board was obtained.

(5-2) Sensitivity Measurement of Photosensitive Resin Film

A test piece, which was obtained by subjecting the carrier film of the laminate for evaluation obtained as described above to the same treatments as in the above (1-2), was exposed to the atmosphere at −65° C. for 15 minutes, and then heated at a temperature increase rate of 180° C./min. Subsequently, the test piece was exposed to the atmosphere at 150° C. for 15 minutes, and then cooled at a temperature decrease rate of 180° C./min. Such a thermal cycle was repeated 1,000 times.

Thereafter, the laminate for evaluation was observed at any ten positions in an opening of a square via having 2 mm square by a metallurgical microscope with a magnification of 100 times, and then the degree of crack and stripping was evaluated according to the following evaluation criteria.

A: No crack nor stripping was observed at all.

B: Crack and stripping were observed at one or two positions among the ten positions.

C: Crack and stripping were observed at three positions among the ten positions.

D: The crack and stripping were observed at four or more positions among the ten positions.

<Synthesis Example 1> Synthesis of Acid-Modified Ethylenically Unsaturated Group and Alicyclic Structure-Containing Epoxy Derivative 1 [Component (A1)]

350 parts by mass of a dicyclopentadiene type epoxy resin ("XD-1000" manufactured by Nippon Kayaku Co., Ltd., epoxy equivalent: 252 g/eq, softening point: 74.2° C., corresponding to the component (a1) and represented by the general formula (a1-1), ring carbon atoms in alicyclic structure: 10), 70 parts by mass of acrylic acid (corresponding to the component (a2)), 0.5 parts by mass of methyl hydroquinone, and 120 parts by mass of carbitol acetate were added and allowed to react with each other while heating to 90° C. and stirring, thereby dissolving the mixture.

Subsequently, the obtained solution was cooled to 60° C., 2 parts by mass of triphenyl phosphine was added, and the mixture was heated at 100° C. to perform the reaction until an acid value of the solution became 1 mgKOH/g. To the solution after the reaction, 98 parts by mass of tetrahydrophthalic anhydride (corresponding to the component (a3)) and 85 parts by mass of carbitol acetate were added, and the mixture was heated to 80° C. to perform the reaction for 6 hours.

Thereafter, the resultant was cooled to room temperature to obtain an acid-modified dicyclopentadiene type epoxy acrylate having a solid component concentration of 73% by mass (corresponding to the component (A1) and the component (A1-1), hereinafter referred to as an "acid-modified ethylenically unsaturated group and alicyclic structure-containing epoxy derivative 1").

Examples 1 to 5 and Comparative Example 1

(Preparation of Photosensitive Resin Composition)

Compositions were blended according to blending compositions and blending amounts shown in Table 1, and kneaded with a 3-roll mill to prepare photosensitive resin compositions. In each of Examples, carbitol acetate was appropriately added to adjust the concentration, thereby obtaining a photosensitive resin composition having a solid component concentration of 60% by mass.

(Preparation of Photosensitive Resin Film)

A polyethylene terephthalate film (trade name: G2-25, manufactured by Teijin Limited) having a thickness of 25 μm was used as a carrier film. The carrier film was coated with the photosensitive resin composition prepared in each of Examples, and was dried using a hot air convection drier at 100° C. for 10 minutes, to form a photosensitive resin film (photosensitive layer) having a thickness of 25 μm. Continuously, on the surface of the photosensitive resin film (photosensitive layer) at the opposite side to the side coming into contact with the carrier film, a biaxially stretched polypropylene film (trade name: MA-411, manufactured by Oji F-Tex Co., Ltd.) was stuck as a protective film, to prepare a photosensitive resin film having the carrier film and the protective film stuck thereon.

Using the thus-prepared photosensitive resin films, the respective evaluations were performed according to the above methods. The results are shown in Table 1.

TABLE 1

| | | | | Example | | | | | Comparative Example |
|---|---|---|---|---|---|---|---|---|---|
| | | | | 1 | 2 | 3 | 4 | 5 | 1 |
| Photosensitive resin composition | (A) | (A1) | Acid-modified ethylenically unsaturated group and alicyclic structure-containing epoxy derivative 1 | 40 | 40 | 40 | 40 | 40 | 40 |
| | | (Aiii) | Dipentaerythritol pentaacrylate | 10 | 10 | 10 | 10 | 10 | 10 |
| | (X) | | Core-shell particles 1 | 5 | 10 | 20 | 40 | | |
| | | | Core-shell particles 2 | | | | | 10 | |
| | (B) | | Photopolymerization initiator 1 | 0.25 | 0.25 | 0.25 | 0.25 | 0.25 | 0.25 |
| | | | Photopolymerization initiator 2 | 0.04 | 0.04 | 0.04 | 0.04 | 0.04 | 0.04 |
| | (C) | | Biphenyl type epoxy resin | 15 | 15 | 15 | 15 | 15 | 15 |
| | | | Epoxy-modified polybutadiene | 2 | 2 | 2 | 2 | 2 | 2 |
| | (D) | | Polyester-based elastomer | 2.3 | 2.3 | 2.3 | 2.3 | 2.3 | 2.3 |
| | (F) | | Silica | 30 | 30 | 30 | 30 | 30 | 30 |
| Evaluation result | 1. | | Resolution of via | A | A | A | B | B | A |
| | 2. | | Adhesion strength to plated copper (peel strength) | A | A | A | A | B | C |
| | 3. | | Surface roughness (Ra) | A | A | A | A | B | C |
| | 4. | | HAST resistance | A | A | A | A | A | B |
| | 5. | | Crack resistance | B | A | A | A | A | C |

* The unit of the blending amount of each component is part by mass. In the case of a solution, the blending amount is expressed in terms of solid content.

The respective components used in the respective examples are as follows.

Component (A);

Acid-modified ethylenically unsaturated group and alicyclic structure-containing epoxy derivative 1 [Component (A1)]: one obtained in Synthesis Example 1 was used.

Dipentaerythritol pentaacrylate [Component (Aiii)]

Component (X):

Core-shell particles 1 (core: styrene-butadiene copolymer, shell: acrylic acid ester copolymer) (average value of primary particle diameters: 0.1 μm)

Core-shell particles 2 (core: acrylic acid ester copolymer, shell: epoxy resin) (average value of primary particle diameters: 0.1 μm)

Here, the average values (volume average particle diameters) of the primary particle diameters of the core-shell particles 1 and 2 are particle diameters at an integrated value of 50% (volume basis) in a particle size distribution obtained by measuring particles dispersed in a solvent at a refractive index of 1.38 in accordance with International Standard ISO13321, using a zeta potential and particle size distribution analyzer (manufactured by Beckman Coulter, Inc.).

Component (B):

Photopolymerization initiator 1: 2-methyl-1-[4-(methylthio)phenyl]-2-morpholino-1-propanone, acetophenone compound Photopolymerization initiator 2: 2,4-diethylthioxanthone, thioxanthone compound Component (C):

Biphenyl type epoxy resin: "YX-4000" (trade name, manufactured by Mitsubishi Chemical Corporation)

Epoxy-modified polybutadiene: "EPOLEAD (registered trademark) PB3600" (trade name, manufactured by Daicel Corporation)

Component (D):

Polyester-based elastomer: "ESPEL (registered trademark) 1108" (trade name, manufactured by Showa Denko Materials Co., Ltd.)

Component (E):

Silica: "SFP-20M" (trade name, average particle diameter: 0.3 μm, manufactured by Denka Company Limited)

According to Table 1, in Examples 1 to 5, the resolution of via, the adhesion strength to plated copper, the electrical insulation reliability, and the crack resistance are excellent, and the surface roughness Ra is small. Since the surface roughness Ra of the interlayer insulating layer formed of the photosensitive resin composition is small, a fine surface shape can be formed on the surface of the interlayer insulating layer, and fine wirings tend to be easily formed. Further, it is worth noting that even though the surface roughness Ra is small, the adhesion strength to plated copper is high.

On the other hand, in Comparative Example 1 in which the component (X) is not contained, although the resolution of via is good, the adhesion strength to plated copper, the electrical insulation reliability, and the crack resistance are insufficient, which result in large surface roughness Ra.

REFERENCE SIGNS LIST

100A: Multilayer printed wiring board
102: Circuit pattern
103: Interlayer insulating layer
104: Via (via hole)
105: Seed layer
106: Resist pattern
107: Circuit layer of copper
108: Solder resist layer

The invention claimed is:

1. A photosensitive resin composition comprising:

(A) a photopolymerizable compound having an ethylenically unsaturated group;

(X) organic particles; and (B) a photopolymerization initiator, wherein the photopolymerizable compound (A) having an ethylenically unsaturated group contains (A1) a photopolymerizable compound having an acidic substituent and an alicyclic structure together with an ethylenically unsaturated group, the organic particles (X) contain core-shell particles, and a combination (core/shell) of a component constituting cores of the core-shell particles and a component constituting shells thereof is styrene-butadiene copolymer/(meth)acrylic acid ester copolymer, (meth)acrylic acid ester copolymer/epoxy resin, epoxy resin/silicone rubber, acrylonitrile-butadiene copolymer/(meth) acrylic acid ester copolymer, polyethylene/(meth) acrylic acid ester copolymer, polybutadiene/(meth) acrylic acid ester copolymer, or polyester/(meth)acrylic acid ester copolymer.

2. The photosensitive resin composition according to claim 1, wherein the photopolymerizable compound (A) having an ethylenically unsaturated group further contains at least one selected from the group consisting of (Ai) a monofunctional vinyl monomer having one polymerizable ethylenically unsaturated group, (Aii) a bifunctional vinyl monomer having two polymerizable ethylenically unsaturated groups, and (Aiii) a polyfunctional vinyl monomer having at least three polymerizable ethylenically unsaturated groups.

3. The photosensitive resin composition according to claim 1, wherein in the photopolymerizable compound (A1) having an acidic substituent and an alicyclic structure together with an ethylenically unsaturated group, the alicyclic structure is an alicyclic structure having 5 to 20 ring carbon atoms.

4. The photosensitive resin composition according to claim 1, wherein in the photopolymerizable compound (A1) having an acidic substituent and an alicyclic structure together with an ethylenically unsaturated group, the alicyclic structure is composed of two or more rings.

5. The photosensitive resin composition according to claim 1, further comprising:

(C) a thermosetting resin.

6. The photosensitive resin composition according to claim 1, further comprising:

(D) an elastomer.

7. The photosensitive resin composition according to claim 6, wherein the elastomer (D) contains at least one selected from the group consisting of a styrenic elastomer, an olefinic elastomer, a polyester-based elastomer, a urethane-based elastomer, a polyamide-based elastomer, an acrylic elastomer, and a silicone-based elastomer.

8. The photosensitive resin composition according to claim 1, further comprising:

(F) an inorganic filler.

9. A photosensitive resin composition for photo via formation, comprising:

the photosensitive resin composition according to claim 1.

10. A photosensitive resin composition for interlayer insulating layer, comprising:

the photosensitive resin composition according to claim 1.

11. A photosensitive resin film comprising:

the photosensitive resin composition according to claim 1.

12. A photosensitive resin film for interlayer insulating layer, comprising:

the photosensitive resin composition according to claim 1.

13. A multilayer printed wiring board comprising:

an interlayer insulating layer formed of the photosensitive resin composition according to claim 1.

14. A multilayer printed wiring board comprising:

an interlayer insulating layer formed of the photosensitive resin film according to claim 11.

15. A semiconductor package comprising:

the multilayer printed wiring board according to claim 13, and a semiconductor device.

16. A method for producing a multilayer printed wiring board, comprising the following (1) to (4):

(1): laminating the photosensitive resin film according to claim 11 on one surface or both surfaces of a circuit substrate;

(2): exposing and developing the photosensitive resin film laminated in the (1), to form an interlayer insulating layer having a via;

(3): subjecting the via and the interlayer insulating layer to a roughening treatment; and (4): forming a circuit pattern on the interlayer insulating layer.

* * * * *